(12) United States Patent
Vijayakumar et al.

(10) Patent No.: US 11,974,390 B2
(45) Date of Patent: *Apr. 30, 2024

(54) REDUCTION OF PACKAGING SUBSTRATE DEFORMATION

(71) Applicant: SKYWORKS SOLUTIONS, INC., Woburn, MA (US)

(72) Inventors: Bhuvaneshwaran Vijayakumar, Irvine, CA (US); Lori Ann Deorio, Irvine, CA (US); Anthony James Lobianco, Irvine, CA (US); Hoang Mong Nguyen, Fountain Valley, CA (US); Robert Francis Darveaux, Corona Del Mar, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/107,142

(22) Filed: Feb. 8, 2023

(65) Prior Publication Data

US 2023/0262877 A1 Aug. 17, 2023

Related U.S. Application Data

(63) Continuation of application No. 16/588,884, filed on Sep. 30, 2019, now Pat. No. 11,596,056.

(60) Provisional application No. 62/740,331, filed on Oct. 2, 2018.

(51) Int. Cl.
*H05K 1/02* (2006.01)
*H05K 1/11* (2006.01)
*H05K 3/24* (2006.01)
*H03F 3/19* (2006.01)

(52) U.S. Cl.
CPC ............. *H05K 1/0243* (2013.01); *H05K 1/11* (2013.01); *H05K 3/24* (2013.01); *H03F 3/19* (2013.01)

(58) Field of Classification Search
CPC .. H05K 1/0271; H05K 1/0165; H05K 1/0281; H05K 1/0278; H05K 1/11; H05K 2201/2009; H05K 3/24
See application file for complete search history.

(56) References Cited

U.S. PATENT DOCUMENTS

| 4,832,621 A | 5/1989 | Asai et al. |
| 6,448,639 B1 | 9/2002 | Ma |
| 6,902,955 B2 | 6/2005 | Tomihara |

(Continued)

OTHER PUBLICATIONS

Non-Final Rejection for U.S. Appl. No. 16/588,884 dated Nov. 19, 2021, 11 pages.

(Continued)

*Primary Examiner* — Hoa C Nguyen
(74) *Attorney, Agent, or Firm* — Chang & Hale LLP

(57) ABSTRACT

A packaging substrate can include a first surface and a second opposing surface, the first surface including a first mounting region of a first electronic module region and the second opposing surface including a first electrical contacts region of the first electronic module region. The packaging substrate can include a saw street region with at least a portion that surrounds the first electronic module region, and a saw street feature formed on the second opposing surface within at least a portion of the saw street region, the saw street feature being a solder mask layer over a metal layer.

18 Claims, 16 Drawing Sheets

(56) References Cited

U.S. PATENT DOCUMENTS

| | | | |
|---|---|---|---|
| 10,535,806 B2 | 1/2020 | Leirer et al. | |
| 2005/0023704 A1* | 2/2005 | Lin | H01L 23/50 |
| | | | 257/E23.079 |
| 2007/0241764 A1* | 10/2007 | Naito | H05K 1/0269 |
| | | | 324/759.02 |
| 2012/0282735 A1 | 11/2012 | Ahn et al. | |
| 2012/0292772 A1 | 11/2012 | Yorita et al. | |
| 2014/0145317 A1* | 5/2014 | Nakamura | H05K 1/0271 |
| | | | 257/669 |
| 2015/0014849 A1 | 1/2015 | Woo et al. | |
| 2015/0223319 A1 | 8/2015 | Muto | |
| 2017/0103944 A1* | 4/2017 | Fukui | H01L 23/49827 |
| 2017/0257952 A1* | 9/2017 | Adachi | H05K 1/181 |
| 2020/0321312 A1 | 10/2020 | Umezawa | |

OTHER PUBLICATIONS

Final Rejection for U.S. Appl. No. 16/588,884 dated Mar. 23, 2022, 11 pages.

Notice of Allowance for U.S. Appl. No. 16/588,884 dated Jul. 7, 2022, 9 pages.

Notice of Allowance for U.S. Appl. No. 16/588,884 dated Oct. 20, 2022, 9 pages.

* cited by examiner

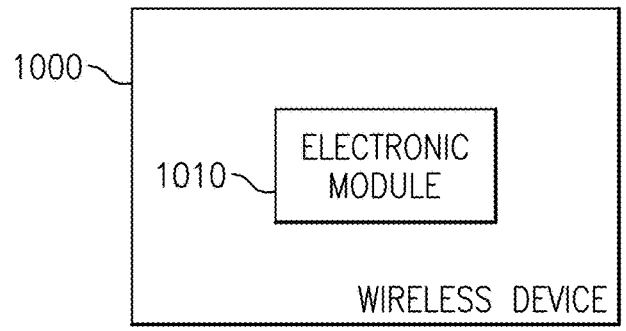

```
                                                              ┌─1102
┌──────────────────────────────────────────────────────────┐
│  PROVIDE OR FORM A PACKAGING SUBSTRATE WHICH             │
│  COMPRISES ON A FIRST SURFACE A MOUNTING REGION TO       │
│  ALLOW MOUNTING OF ELECTRONIC COMPONENTS THEREON,        │
│  AND ON A SECOND OPPOSING SURFACE ELECTRICAL CONTACTS    │
│  FORMED THEREON, AND A SAW STREET REGION SURROUNDING     │
│                  THE MOUNTING REGION                     │
└──────────────────────────────────────────────────────────┘
```

```
                                                              ┌─1104
┌──────────────────────────────────────────────────────────┐
│  FORM A METAL LAYER AND A SOLDER MASK LAYER WITHIN THE   │
│  SAW STREET REGION ON THE SECOND OPPOSING SURFACE, THE   │
│  SOLDER MASK LAYER BEING FORMED OVER THE METAL LAYER     │
└──────────────────────────────────────────────────────────┘
```

```
                                                              ┌─1202
┌──────────────────────────────────────────────────────────┐
│  PROVIDE OR FORM A MOUNTING REGION ON A FIRST SURFACE    │
│  OF A PACKAGING SUBSTRATE TO ALLOW MOUNTING OF           │
│  ELECTRONIC COMPONENTS THEREON, AND A GROUND PAD ON A    │
│  SECOND OPPOSING SURFACE OF THE PACKAGING SUBSTRATE      │
└──────────────────────────────────────────────────────────┘
```

```
                                                              ┌─1204
┌──────────────────────────────────────────────────────────┐
│  FORM A SOLDER MASK LAYER HAVING A PLURALITY OF          │
│         OPENINGS OVER THE GROUND PAD                     │
└──────────────────────────────────────────────────────────┘
```

FIG.12

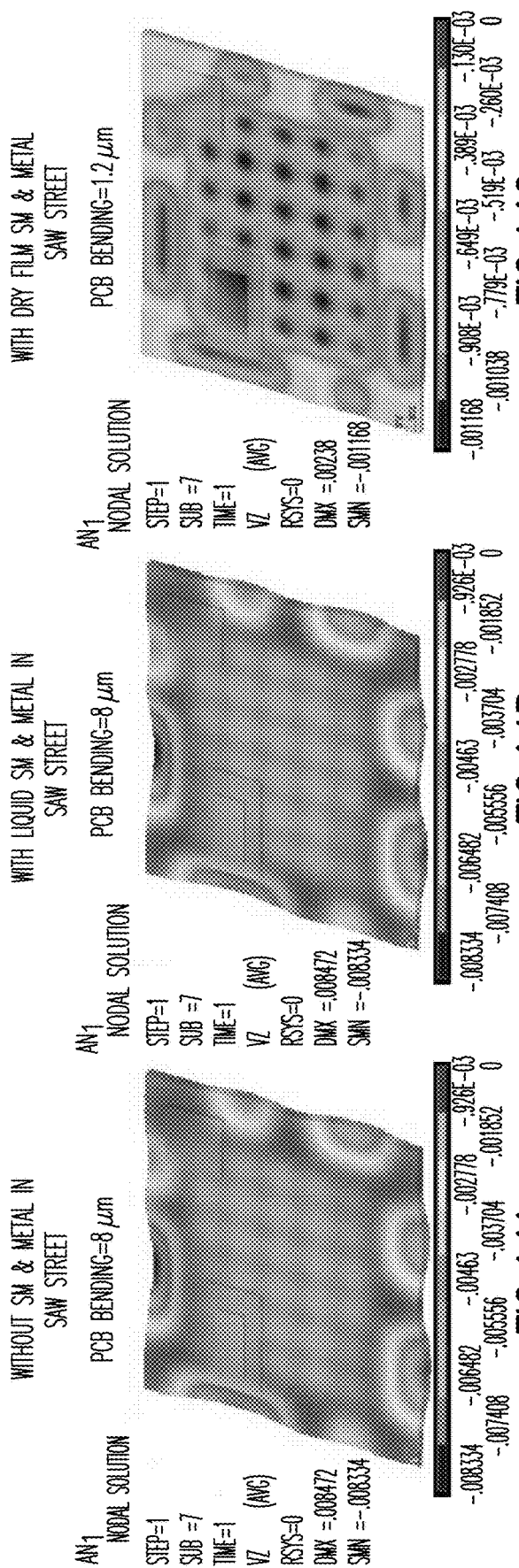
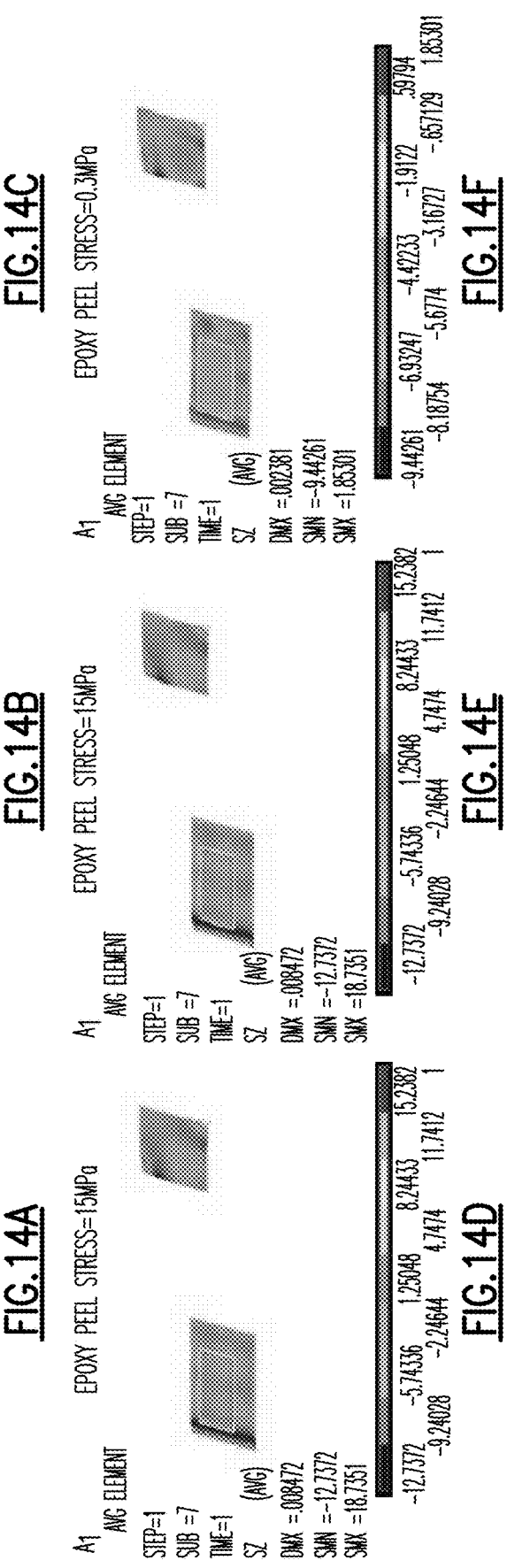
FIG.14A FIG.14B FIG.14C
FIG.14D FIG.14E FIG.14F

REDUCTION OF PACKAGING SUBSTRATE DEFORMATION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. patent application Ser. No. 16/588,884, filed on Sep. 30, 2019, entitled METHODS AND DEVICES RELATED TO REDUCED PACKAGING SUBSTRATE DEFORMATION, which claims priority to U.S. Provisional Application No. 62/740,331 filed on Oct. 2, 2018, entitled METHODS AND DEVICES RELATED TO REDUCED PACKAGING SUBSTRATE DEFORMATION, the disclosure of each of which are hereby expressly incorporated by reference herein in their respective entirety.

BACKGROUND

Field

The present disclosure relates to electronic devices and fabrication of electronic devices, such as packaging substrates and fabrication processes to provide the packaging substrates for incorporation into the electronic devices.

Description of the Related Art

Packaging substrates can be incorporated into electronic devices for use in various electronic applications, including mobile electronic applications. For example, the packaging substrates can be configured for use in radio-frequency (RF) applications, including mobile RF applications.

SUMMARY

In some implementations, the present disclosure relates to a packaging substrate which includes a first surface and a second opposing surface, the first surface having a mounting region configured to receive electronic components, and electrical contacts formed on the second opposing surface. The packaging substrate further includes a saw street region surrounding the mounting region and the electrical contacts. A metal layer and a solder mask layer is formed within the saw street region on the second opposing surface, the solder mask layer being formed over the metal layer.

In some embodiments, the metal layer and the solder mask layer formed within the saw street region on the second opposing surface can surround the electrical contacts. In some embodiments, the metal layer can have a height the same as a height of an electrical contact formed on the second opposing surface.

In some embodiments, an electrical contact formed on the second opposing surface can include an electrical contact solder mask layer formed on at least a portion thereof, the electrical contact solder mask layer having a height the same as a height of the solder mask layer. In some embodiments, the solder mask layer and the metal layer have a width less than a width of the saw street region.

In some embodiments, the packaging substrate can further include an electrical contact solder mask layer over at least a portion of an electrical contact formed on the second opposing surface, a total height of the solder mask layer and the metal layer formed within the saw street region being the same as a total height of the electrical contact and the electrical contact solder mask layer.

In some embodiments, the electrical contacts can include a ground pad having a ground pad solder mask layer formed thereon, the ground pad solder mask layer having a plurality of openings. In some embodiments, the ground pad solder mask layer can have a grid pattern. In some embodiments, each of the plurality of openings can have a width of no less than about 0.4 millimeters. In some embodiments, an electrical contact formed on the second opposing surface can include an electrical contact solder mask layer formed on at least a portion thereof, the electrical contact and the electrical contact solder mask layer having a total height the same as a total height of the ground pad solder mask layer and the ground pad.

In some embodiments, the electronic components can include a power amplifier.

According to some teachings, the present disclosure relates to an electronic module which includes a packaging substrate including a first surface and a second opposing surface, the first surface including a mounting region. The electronic module further includes a plurality of electronic components mounted on the mounting region, and a ground pad formed on the second opposing surface of the packaging substrate, the ground pad including a solder mask layer formed thereon, the solder mask layer having a plurality of openings.

In some embodiments, the solder mask layer can include a grid pattern. In some embodiments, each of the plurality of openings has a width of no less than 0.4 millimeters.

In accordance with some implementations, the present disclosure relates to a method of fabricating a packaging substrate. The method includes providing or forming a mounting region on a first surface of the packaging substrate to allow mounting of electronic components thereon, and electrical contacts on a second opposing surface of the packaging substrate, and a saw street region surrounding the mounting region. The method can further includes forming a metal layer and a solder mask layer within the saw street region on the second opposing surface, the solder mask layer being formed over the metal layer.

In some embodiments, forming the metal layer and the solder mask layer within the saw street region on the second opposing surface includes forming the metal layer and the solder mask layer to surround the electrical contacts. In some embodiments, forming the metal layer and the solder mask layer within the saw street region on the second opposing surface includes forming a metal layer having a height the same as a height of an electrical contact formed on the second opposing surface.

In some embodiments, the method can further include forming an electrical contact solder mask layer over at least a portion of an electrical contact on the second opposing surface, a total height of the solder mask layer and the metal layer formed within the saw street region being the same as a total height of the electrical contact and the electrical contact solder mask layer.

In some implementations, the present disclosure relates to a method of fabricating an electronic module. The method includes providing or forming a mounting region on a first surface of a packaging substrate mounting of electronic components thereon, and a ground pad on a second opposing surface of the packaging substrate. The method further includes forming a solder mask layer having a plurality of openings over the ground pad.

In some embodiments, forming the solder mask layer can include forming a solder mask layer having a grid pattern.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 10 shows a schematic diagram of a wireless device which can include an electronic module.

FIG. 11 is an example of a packaging substrate fabrication process.

FIG. 12 is an example of an electronic module fabrication process.

FIGS. 14A, 14B and 14C show simulations of the degree of bending of various packaging substrates, and FIGS. 14D, 14E and 14F show simulations of the epoxy peel stress corresponding to each of the substrates of FIGS. 14A, 14B and 14C, respectively.

DETAILED DESCRIPTION OF SOME EMBODIMENTS

Figure 1:
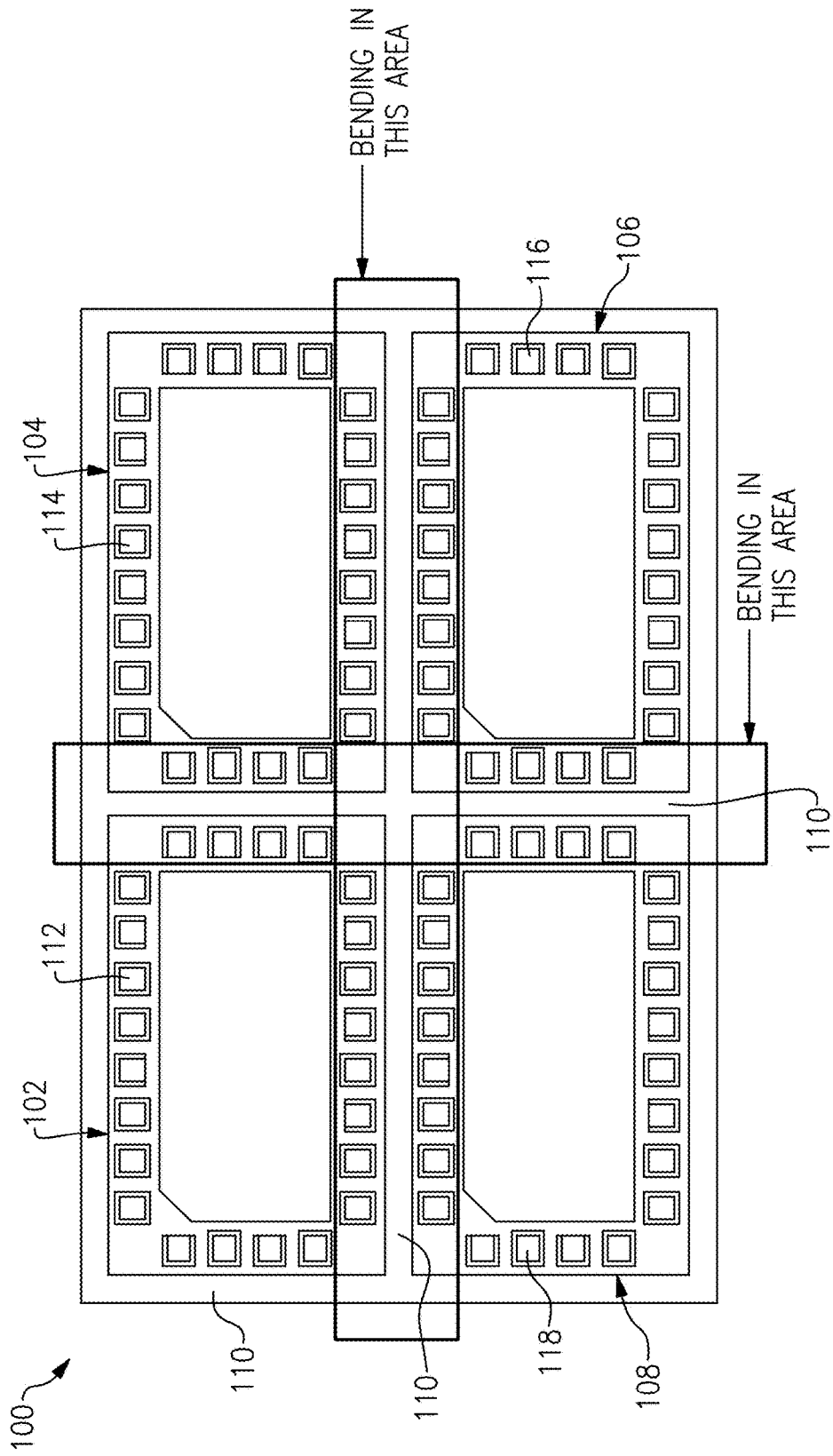
FIG. 1 shows a plan view of a packaging substrate which can exhibit deformation during a high-pressure manufacturing process.

The headings provided herein, if any, are for convenience only and do not necessarily affect the scope or meaning of the claimed invention.

In electronics manufacturing, electronic components can be mounted on a first surface, such as an upward-facing surface, of a packaging substrate, and electrical contacts can be formed on an opposing second surface, such as a downward-facing surface, of the packaging substrate. The packaging substrate can have a plurality of mounting regions on the upward-facing surface for mounting electronic components and a corresponding plurality of electrical contacts regions on the downward-facing surface comprising electrical contacts. To provide a plurality of electronic modules, electronic components can be mounted in the respective mounting regions. The packaging substrate can be subsequently cut so as to provide a plurality of individual electronic modules. During manufacturing, the packaging substrate can be subjected to high-pressure processes which can tend to warp the packaging substrate.

Packaging substrates can be subjected to a high-pressure encapsulation process, such as an overmolding process, after desired electronic components have been mounted thereon. The overmolding process can be performed to encapsulate the packaging substrates within a protective material, such as a polymeric material, for example to provide protection for the packaging substrate from the surrounding environment. Pressure applied during a high-pressure process, such as during an overmolding process, can deform a typical packaging substrate. For example, a downward pressure can be applied upon the upward-facing surface during an overmolding process, often resulting in warping of the typical packaging substrate. The typical packaging substrate can bulge downward, including bulging downward of the downward-facing surface. The typical packaging substrate may become warped and bend downward in the saw street region separating and/or surrounding the plurality of electronic modules, and/or in the electrical contacts regions of the electronic modules. For example, the typical packaging substrate may bend downward in the saw street region along the outer edges of the packaging substrate and in the saw street region between individual electronic modules. In some cases, the typical packaging substrate may bend downward in ground pad areas of the electrical contacts regions. Bending of the packaging substrate can contribute to delamination of die attach epoxy adhesives, mold to packaging substrate delamination, die cracking (e.g., flip chip die cracking), filter solder joint cracking, and/or solder wicking. These and/or other defects can cause electrical shorts, thermal control issues, other electrical failures and/or physical issues which can result in scraping of the electronic modules.

One or more devices and methods described herein can provide packaging substrates which do not or substantially do not become deformed under pressure applied thereupon during high-pressure manufacturing processes, including during overmolding processes. Electronic modules formed therefrom can maintain desired electrical and thermal performance, and physical characteristics. In some embodiments, a packaging substrate described herein can comprise one or more features formed on a downward-facing surface which can facilitate reduced height non-uniformity of the downward-facing surface. In some embodiments, one or more features can be formed in the saw street region and/or the electrical contacts region, so as to facilitate reduced height non-uniformity. A reduced height non-uniformity on the downward-facing surface may improve resistance to bulging downward of the packaging substrate. For example, the packaging substrate can be rested upon a work surface during a high-pressure process, such as an overmolding process. The downward-facing surface of the packaging substrate can be oriented toward the work surface. The packaging substrate can be subjected to downward pressure applied upon its upward-facing surface while the packaging substrate is rested upon the work surface. Features formed on the downward-facing surface to provide reduced height non-uniformity can provide support for the packaging substrate such that the packaging substrate can better withstand the downward pressure exerted upon the packaging substrate, thereby reducing or eliminating warping of the packaging substrate.

In some embodiments, a saw street region on the downward-facing surface can comprise a saw street feature formed therein. In some embodiments, the saw street feature can have a saw street solder mask layer formed over a metal layer (e.g., copper, gold). The saw street feature can be a saw street solder mask layer formed directly on a metal layer. In some embodiments, the electrical contacts region can comprise a feature formed therein to facilitate reduced height non-uniformity. In some embodiments, a ground pad feature can be formed in the electrical contacts region to provide reduced height non-uniformity. Electrical contacts formed on the downward-facing surface can comprise a ground pad on which a feature can be formed to reduce height non-uniformity. The ground pad can have a ground pad solder mask layer comprising a plurality of openings formed thereon. In some embodiments, the ground pad solder mask layer can have a grid pattern.

As described herein, the saw street feature and the ground pad feature can provide reduced height non-uniformity of features formed on the downward-facing surface of the packaging substrate. In some embodiments, a height of the saw street feature can be the same as or similar to that of one or more other features on the downward-facing surface. For example, a total height of the saw street solder mask layer and the metal layer can be the same as or similar to a total height of an electrical contact solder mask layer and an electrical contact over which the electrical contact solder mask layer is formed. In some embodiments, a height of the ground pad feature can and the ground pad be the same as or similar to that of one or more other features on the downward-facing surface. For example, a total height of the ground pad solder mask layer and the ground pad can be the same as or similar to a total height of another electrical contact solder mask layer and another electrical contact over which the other electrical contact solder mask layer is formed.

As described herein, a saw street feature, such as a saw street solder mask layer and a metal layer, can be formed outside of the mounting regions for mounting electronic components and electrical contacts regions in which electrical contacts are formed, use of the saw street feature can advantageously have no or substantially no impact on the design of these regions. In some embodiments, formation of the saw street feature and the ground pad feature can be included into processes for forming the electrical contacts and electrical contact solder mask layers, easing incorporation of these features onto the packaging substrate and reducing impact to fabrication costs of these features. For example, the saw street solder mask layer, the metal layer and the ground pad solder mask layer can be formed in the same steps for forming the electrical contacts and electrical contact solder mask layers, without using a separate and distinct process. In some embodiments, design for the features on the downward-facing surface can include the saw street feature and the ground pad feature. For example, design for the electrical contacts and electrical contact solder mask layers can include design of the saw street solder mask layer, the metal layer and the ground pad solder mask layer, so as to facilitate incorporation of the saw street solder mask layer, the metal layer and the ground pad solder mask layer, into fabrication processes for forming the electrical contacts and electrical contact solder mask layers.

FIG. 1 shows a plan view of a packaging substrate 100 which can be susceptible to undesired deformation after being subjected to a high-pressure manufacturing process. The packaging substrate 100 can have a first electronic module region 102, a second electronic module region 104, a third electronic module region 106 and a fourth electronic module region 108. A packaging substrate can comprise more or fewer electronic module regions. The electronic module regions 102, 104, 106, 108 can be separated by a saw street region 110. Portions of the saw street region 110 can surround each of the electronic module regions 102, 104, 106, 108 and separate the electronic module regions 102, 104, 106, 108 from one another. As described in further detail herein, the packaging substrate 100 can exhibit deformation in the saw street region 110 due to pressure applied upon the packaging substrate during manufacturing.

Referring again to FIG. 1, the surface of the packaging substrate 100 shown in the figure can have corresponding regions comprising electrical contacts formed thereon for each of the electronic module regions 102, 104, 106, 108. The packaging substrate 100 can have a first electrical contacts region 112, a second electrical contacts region 114, a third electrical contacts region 116 and a fourth electrical contacts region 118, for the first electronic module region 102, the second electronic module region 104, the third electronic module region 106, and the fourth electronic module region 108, respectively. The opposing surface of the packaging substrate 100 can comprise corresponding mounting regions (not shown) configured to receive electronic components for each of the electronic module regions 102, 104, 106, 108. For example, the opposing the surface can comprise a first mounting region, a second mounting region, a third mounting region and a fourth mounting region for the first electronic module region 102, the second electronic module region 104, the third electronic module region 106, and the fourth electronic module region 108, respectively. In some embodiments, the surface shown in FIG. 1 can be a downward-facing surface of the packaging substrate 100 and the opposing surface can be an upward-facing surface of the packaging substrate 100. Electronic components can be mounted in each of the mounting regions to provide four electronic modules. A packaging substrate can comprise more or fewer electronic modules. Separating individual electronic modules from one another can comprise cutting through the packaging substrate 100 in at least a portion of the saw street region 110. For example, after electronic components are mounted in the mounting regions to provide four electronic modules, the four electronic modules can be separated from one another by cutting through the packaging substrate 100 in the saw street region 110 between the electronic module regions 102, 104, 106, 108.

The packaging substrate 100 can be subjected to an overmolding process to encapsulate the packaging substrate 100 in a polymeric material, such as after desired electronic components have been mounted in each of the mounting regions. The packaging substrate 100 can become deformed during to the overmolding process. For example, the saw street region 110 can become warped due to pressure applied during the overmolding process. As indicated in FIG. 1, in some embodiments, the saw street region 110 between the first electronic module region 102 and the second electronic module region 104, between the second electronic module region 104 and the third electronic module region 106, between the third electronic module region 106 and the fourth electronic module region 108, and/or between the fourth electronic module region 108 and the first electronic module region 102, can become bent as a result of the overmolding process. In some embodiments, other portions of the saw street region 110 can become bent as a result of the overmolding process. For example, the saw street region 110 along the edges of the packaging substrate 100 can bend under pressure applied during the overmolding process. Pressure applied upon the surface of the packaging substrate 100 opposite that shown in FIG. 1 during overmolding can result in bulging and/or bending of the packaging substrate 100 in the saw street region 110. For example, the packaging substrate 100 can bend outward from the page in the saw street region 110, the surface shown in FIG. 1 bulging outward of the page. As described herein, deformation of the packaging substrate 100 can contribute to various physical, electrical and/or thermal defects, thereby leading to device failure.

Figure 2:
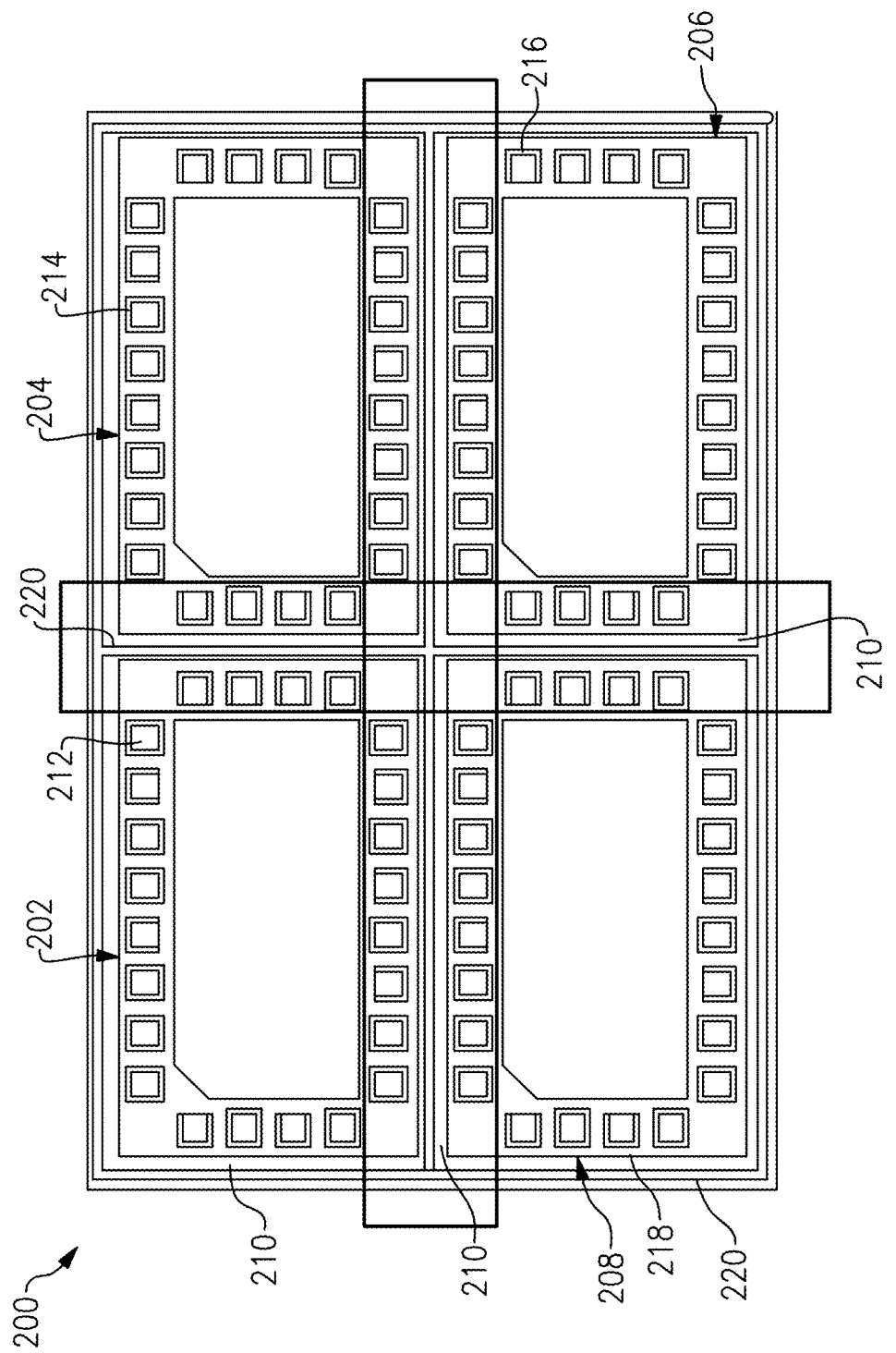
FIG. 2 shows a plan view of an example of a packaging substrate which comprises a saw street feature.

Referring to FIG. 2, a plan view is shown of a packaging substrate 200 which does not or substantially does not exhibit deformation in its saw street region 210 after being subjected to a high-pressure manufacturing process, such as an overmolding process. The packaging substrate 200 can have a first electronic module region 202, a second electronic module region 204, a third electronic module region 206 and a fourth electronic module region 208. The surface of the packaging substrate 200 shown in FIG. 2, such as a downward-facing surface, can have a first electrical contacts region 212, second electrical contacts region 214, third electrical contacts region 216 and fourth electrical contacts region 218, for the first electronic module region 202, second electronic module region 204, third electronic module region 206, and fourth electronic module region 208, respectively. The first electrical contacts region 212, second electrical contacts region 214, third electrical contacts region 216 and fourth electrical contacts region 218 can each comprise electrical contacts formed thereon. The saw street region 210 can surround and separate each of the electronic module regions 202, 204, 206, 208 from one another. The surface of the packaging substrate 200 opposite that shown in FIG. 2, such as an upward-facing surface, can comprise corresponding mounting regions (not shown) configured to receive electronic components for each of the electronic module regions 202, 204, 206, 208.

A saw street feature 220 can be formed on the surface shown in FIG. 2 in the saw street region 210 surrounding and separating the electronic module regions 202, 204, 206, 208. For example, the saw street feature 220 can be formed on the surface throughout the saw street region 210 to surround each of the electronic module regions 202, 204, 206, 208. The saw street feature 220 can extend continuously around each of the electronic module regions 202, 204, 206, 208. In some embodiments, the saw street feature 220 can comprise a solder mask layer formed over a metal layer. In some embodiments, the saw street feature 220 can comprise the solder mask layer formed on the metal layer. For example, the saw street feature 220 can be a metal layer formed directly on the surface of the packaging substrate 200, and a saw street solder mask layer formed directly on the metal layer.

In some embodiments, the metal layer can be copper. In some embodiments, the metal layer can be gold. In some embodiments, the material of the metal layer can be selected based on the material used for electrical contacts formed on the packaging substrate, such as to facilitate incorporation of saw street features into the fabrication process. For example, the metal layer can be the same material as that use for the electrical contacts. In some embodiments, the saw street solder mask layer can be the same material as that used for the electrical contact solder mask layer to facilitate its incorporation into the fabrication process.

The saw street feature 220 can be configured to provide increased height uniformity on the surface shown in FIG. 2. A reduced height non-uniformity can reduce or prevent deformation of the packaging substrate 200 during processes which apply pressure upon the surface opposite that shown in FIG. 2. For example, during an overmolding process, the packaging substrate 200 can be positioned on a work surface, the surface shown in FIG. 2 being oriented toward the work surface, and the pressure applied upon the opposing surface. In some embodiments, the saw street feature 220 can provide improved resistance to bulging of the packaging substrate 200 in the saw street region 210 (e.g., bulging outwardly from the page) during the overmolding process, by providing improved support for the packaging substrate 200 while the packaging substrate 200 is rested upon the work surface.

In some embodiments, a saw street feature can extend along less than the entire saw street region. For example, a saw street feature formed in a saw street region may not completely surround an electronic module region. In some embodiments, a saw street feature can extend along between about 50% to about 100% of a perimeter of an electronic module region, including about 50% to about 90%, about 50% to about 80%, about 50% to about 70%, or about 50% to about 60%. A length of the saw street feature can be selected to provide desired reduction or elimination in packaging substrate deformation. In some embodiments, a saw street feature can extend along at least a portion of the saw street region between adjacent and/or neighboring electronic module regions. In some embodiments, the saw street feature can extend only along the saw street region between adjacent and/or neighboring electronic modules. In some embodiments, the saw street feature is not in the saw street region between adjacent and/or neighboring electronic modules. For example, the saw street feature can be only in the portion of the saw street region along the edges of the packaging substrate. In some embodiments, the saw street feature can comprise a plurality of discrete portions, including a plurality of evenly distributed discrete portions. For example, the plurality of discrete portions can be positioned around an electronic module region. In some embodiments, the plurality of discrete portions can be positioned only between adjacent and/or neighboring electronic modules, or only in portions of the saw street region along edges of the packaging substrate. One or more dimensions (e.g., a length, width, height), number of discrete portions, and/or positioning of any discrete portions, can be selected to provide desired reduction or elimination in packaging substrate deformation, while maintaining desired device performance and impact to costs of manufacturing.

Figure 3:
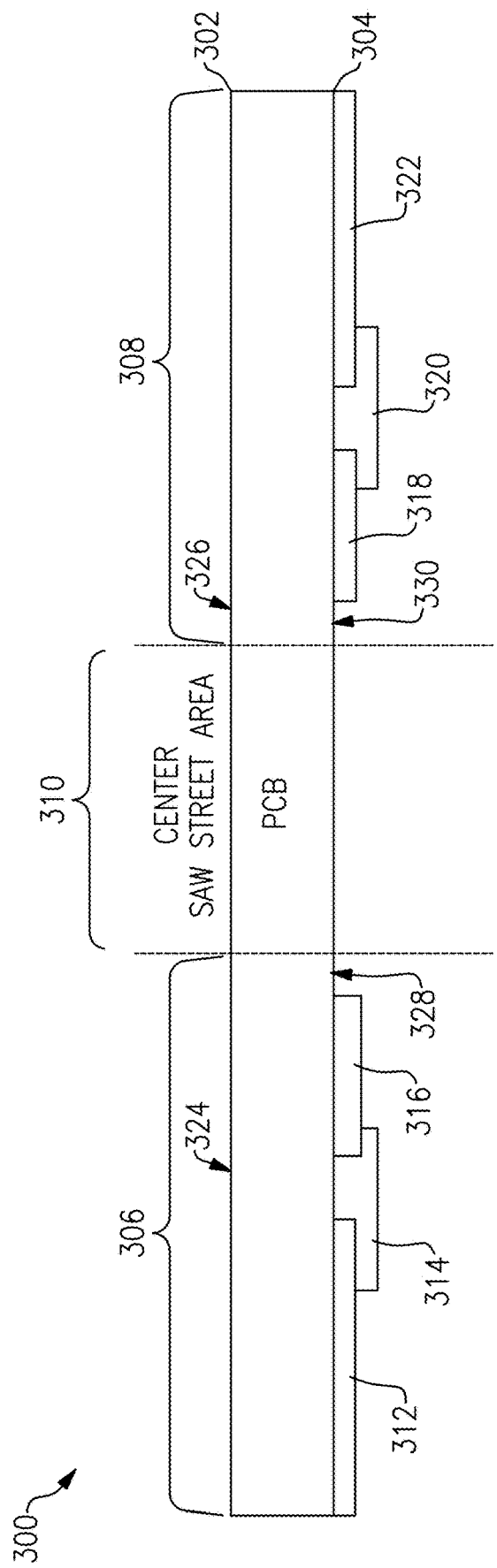
FIG. 3 shows a cross-sectional view of a packaging substrate which can exhibit deformation during a high-pressure manufacturing process.

FIG. 3 is a cross-sectional view of a packaging substrate 300 which does not comprise any saw street features formed thereon. The packaging substrate 300 can have a first surface 302 and a second opposing surface 304 which is opposite the first surface 302. The packaging substrate 300 can have a first electronic module region 306 and a second electronic module region 308 separated by a saw street region 310. No saw street features are formed in the saw street region 310. The packaging substrate 300 may demonstrate deformation in the saw street region 310 after being subjected to pressure applied upon the first surface 302 during a high-pressure manufacturing process, such as an overmolding process. The pressure can be applied in a downward direction upon the first surface 302 such that the second opposing surface 304 may exhibit downward bulging in the saw street region 310.

The first electronic module region 306 can have on the first surface 302 a first mounting region 324 configured to receive one or more electronic components. For example, the first mounting region 324 can be configured to receive a first plurality of electronic components. The second opposing surface 304 of the first electronic module region 306 can have a first electrical contacts region 328 comprising one or more electrical contacts formed thereon. For example, the first electrical contacts region 328 can have a first plurality of electrical contacts formed thereon. In some embodiments, the first electrical contacts region 328 can comprise a first ground pad 312 and a first signal pin 316. The first electrical contacts region 328 can comprise a first electrical contact solder mask layer 314 formed between the first ground pad 312 and the first signal pin 316. In some embodiments, the first electrical contact solder mask layer 314 can comprise a portion formed over a portion of the first ground pad 312 and a portion over a portion of the first signal pin 316.

The second electronic module region 308 can have on the first surface 302 a second mounting region 326 configured to receive one or more electronic components. For example, the second electronic module region 308 can be configured to receive a second plurality of electronic components. The second electronic module region 308 can have on the second opposing surface 304 a second electrical contacts region 330 comprising one or more electrical contacts. For example, the second electrical contacts region 330 can comprise a second plurality of electrical contacts formed thereon. The second electrical contacts region 330 can comprise a second ground pad 322 and a second signal pin 318. A second electrical contact solder mask layer 320 can be formed between the second ground pad 322 and the second signal pin 318. In some embodiments, the second electrical contact solder mask layer 320 can comprise a portion over a portion of the second ground pad 322 and a portion over a portion of the second signal pin 318.

Figure 4:
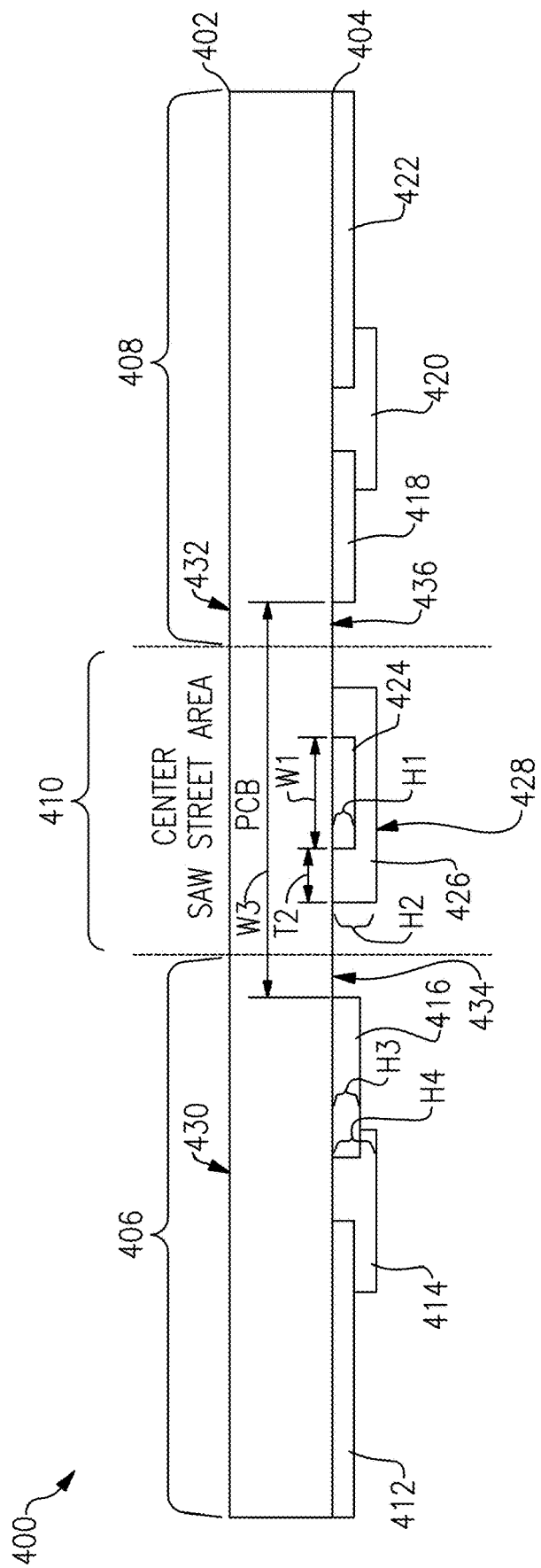
FIG. 4 shows a cross-sectional view of an example of a packaging substrate which comprises a saw street feature formed thereon.

FIG. 4 is a cross-sectional view of a packaging substrate 400 which includes a saw street feature 428. Other features shown in FIG. 4 are similar to or the same as those shown in FIG. 3, with the addition of the saw street feature 428. For example, the packaging substrate 400 can have a first surface 402 and a second opposing surface 404 which is opposite the first surface 402. The packaging substrate 400 can have a first electronic module region 406 and a second electronic module region 408 separated by a saw street region 410. The first electronic module region 406 can have on the first surface 402 a first mounting region 430 and on the second surface 404 a first electrical contacts region 434 (e.g., a first ground pad 412, a first signal pin 416, and a first electrical contact solder mask layer 414 between and over a portion of each of the first ground pad 412 and the first signal pin 416). The second electronic module region 408 can have on the first surface 402 a second mounting region 432 and on the second surface 404 a second electrical contacts region 436 (e.g., a second ground pad 422, a second signal pin 418, and a second electrical contact solder mask layer 420 between and over a portion of each of the second ground pad 422 and the second signal pin 418).

The saw street feature 428 can be formed on the second surface 404 in the saw street region 410. Cutting through the packaging substrate 400 along the saw street region 410 can be performed to separate the electronic modules 406, 408.

The saw street feature 428 can be positioned in the saw street region 410 so as to allow cutting of the packaging substrate 400 to separate the first electronic module region 406 from the second electronic module region 408 without or substantially without cutting through the saw street feature 428, while also not damaging the electronic module regions 406, 408. For example, after electronic components are mounted onto the first mounting region 430 and second mounting region 432 to provide respective electronic modules, the packaging substrate 400 can be cut to separate the electronic modules. In some embodiments, the saw street feature 428 can centered or substantially centered along the saw street region 410. In some embodiments, for separating the first electronic module region 406 from the second electronic module region 408, the packaging substrate 400 can be cut both along a path that runs along the saw street region 410 in the space between the saw street feature 428 and the first electronic module region 406, and along a path that runs along the saw street region 410 in the space between the saw street feature 428 and the second electronic module 408. The saw street feature 428 can be excluded from the resulting electronic modules fabricated using the separated portions of the packaging substrate 400.

The saw street feature 428 can comprise a saw street solder mask layer 426 formed over a metal layer 424. As shown in FIG. 4, in some embodiments, the saw street feature can be a saw street solder mask layer 426 over a metal layer 424. For example, the metal layer 424 can be formed directly on the second surface 404, and the saw street solder mask layer 426 can be formed directly on the metal layer 424.

The saw street feature 428 can be dimensioned to provide desired reduction in height non-uniformity across features formed on the second surface 404. In some embodiments, the saw street feature 428 can be dimensioned to provide desired reduction in costs of manufacturing, facilitate maintaining desired electrical performance for the electronic modules 406, 408, while allowing for desired cutting through of the packaging substrate 400 in the saw street region 410. Referring to FIG. 4, the metal layer 424 can have a width W1 and a height H1. The saw street solder mask layer 426 can have a thickness T2. The saw street solder mask layer 426 and the metal layer 424 can have a total height H2. The saw street region 410 can have a width W3. An adjacent and/or neighboring electrical contact, such as the first signal pin 416, can have a height H3, and an adjacent and/or neighboring electrical contact solder mask layer and an adjacent and/or neighboring electrical contact, such as the first electrical contact solder mask layer 414 and the first signal pin 416, can have a total height H4. The adjacent and/or neighboring electrical contact can be another electrical contact (e.g., the first ground pad 412, second ground pad 418, second signal pin 422). The adjacent and/or neighboring solder mask layer can be another solder mask layer (e.g., the second electrical contact solder mask layer 420). In some embodiments, a width of the metal layer 424 (W1) can be as wide as possible and the thickness of the saw street solder mask layer 426 (T2) can be as thick as possible, while maintaining desired electrical performance and allowing cutting of the packaging substrate 400 without or substantially without damaging the electronic module regions 406, 408, and without or substantially without having to cut through the saw street feature 428. For example, T2 and W1 can be selected such that space remaining in the saw street region 410 with the width W3 is sufficient to enable desired cutting of the packaging substrate 400. Variations in thickness (T2) of the saw street solder mask layer 426 in regions which are and are not over the metal layer 424 can be due to manufacturing processes for forming the solder mask layer.

In some embodiments, the height of the metal layer 424 (H1) can be the same as or similar to a height of an adjacent and/or neighboring electrical contact, such as the height of the first signal pin 412 (H3). The adjacent and/or neighboring electrical contact can be another electrical contact (e.g., the first ground pad 412, second ground pad 418, second signal pin 422). In some embodiments, the total height of the saw street solder mask layer 426 and the metal layer 424 (H2) can be the same as or similar to a height of an adjacent and/or neighboring solder mask layer formed over electrical contact layer, such as the total height of the first electrical contact solder mask layer 414 formed over the first signal pin 416 (H4). In some embodiments, the adjacent and/or neighboring solder mask layer can be the second electrical contact solder mask layer 420. In some embodiments, the adjacent and/or neighboring electrical contact can be another electrical contact (e.g., the first ground pad 412, second ground pad 418, second signal pin 422). In some embodiments, the electrical contacts can have a same or similar height. In some embodiments, the electrical contact solder mask layers can have a same or similar height. In some embodiments, the thickness T2 (i.e. height) of the portion of the saw street solder mask layer 426 over the metal layer 424 can be the same or substantially the same as the height of an adjacent and/or neighboring solder mask layer formed over an electrical contact layer (e.g., the first electrical contact solder mask layer 414, the second electrical contact solder mask layer 420).

Figure 5:
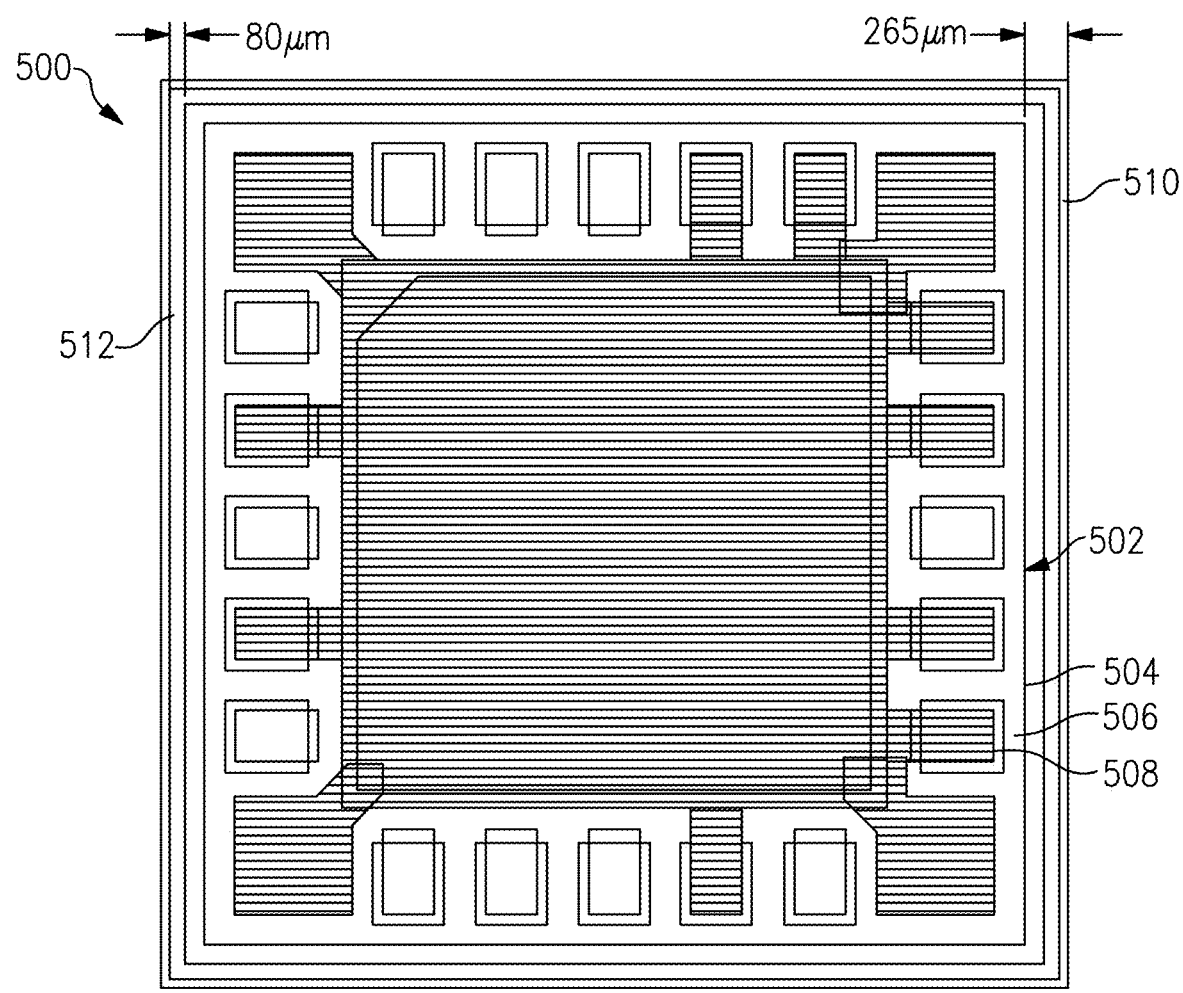
FIG. 5 shows a plan view of an example of a packaging substrate comprising a saw street feature formed thereon.

FIG. 5 is a plan view of a packaging substrate 500 comprising an example of a saw street feature 512. FIG. 5 shows one example of a saw street region width and a saw street feature width. It will be understood that the values shown in FIG. 5 are for illustrative purposes. Other values may also be applicable. The packaging substrate 500 can have an electronic module region 502 comprising an electronic module boundary 504. For example, the electronic module boundary 504 can define an outer periphery of the electronic module region 502. The surface of the packaging substrate 500 shown in FIG. 5 can comprise an electrical contacts region 506 for the electronic module region 502. The electrical contacts region 506 can comprise a plurality of electrical contacts 508 formed thereon. The opposing surface (not shown) of the packaging substrate 500 can comprise a corresponding mounting region for the electronic module region 502, the mounting region being configured to receive a plurality of electronic components.

The electronic module region 502 can be surrounded by a saw street region 510. The saw street feature 512 can be formed within the saw street region 510. The saw street feature 512 can comprise one or more features of the saw street feature 428 described with reference to FIG. 4. For example, the saw street feature 512 can comprise a saw street solder mask layer formed over a metal layer. In some embodiments, the saw street feature 512 can be a saw street solder mask layer formed directly on a metal layer. As shown in FIG. 5, the saw street feature 512 can extend continuously around the perimeter of the electronic module region 502 and completely surround the electronic module region 502. In some embodiments, the saw street feature 512 can be centered or substantially centered in the saw street region 510. In some embodiments, separating the electronic module region 502 from the packaging substrate 500 can include cutting the packaging substrate 500 along or adjacent to the electronic module boundary 504 such that the saw street feature 512 is excluded and discarded. For example, an electronic device into which the electronic module region 502 is incorporated does not include the saw street feature 512 formed in the saw street region 510. Positioning of the saw street feature 512 in the saw street region 510 can be selected to facilitate separation of the saw street feature 512 from the electronic module region 502. In some embodiments, the saw street feature 512 can be spaced further away from the electronic module boundary 504 than from an edge of the packaging substrate 500.

In the example shown, the saw street region 510 can have a width of about 265 microns (μm) and the saw street feature 512 can have a width of about 80 microns (μm). In this example, the width of the saw street feature 512 can be about 30% of the width of the saw street region 510. It will be understood that other widths of the saw street feature 512 and saw street region 510 can be applicable. In some embodiments, the width of the saw street feature 512 can be about 50% of the width of the saw street region 510, including about 45%, about 40%, about 35%, or about 25%.

In some embodiments, the saw street feature 512 may not completely surround the electronic module region 502. In some embodiments, the saw street feature 512 may not extend continuously around the perimeter of the electronic module region 502. For example, the saw street feature 512 can comprise discrete opposing portions positioned along opposing portions of the saw street region 510, including in the saw street region 510 along opposing edges of the electronic module region 502. In some embodiments, the saw street feature 512 can comprise a plurality of discrete portions distributed, at regular or irregular intervals, around the perimeter of the electronic module region 502.

Figure 6:
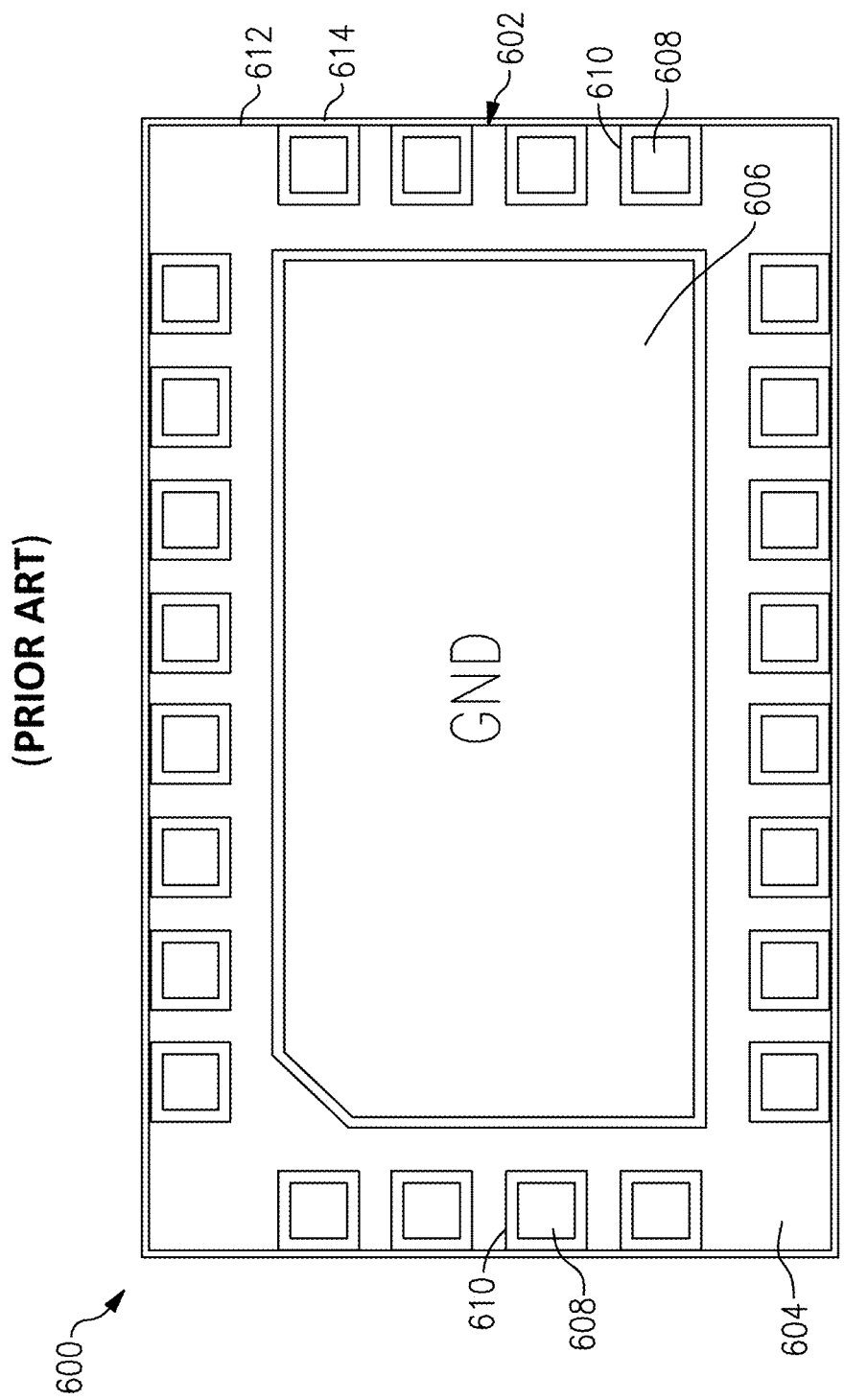
FIG. 6 shows a plan view of a packaging substrate which can exhibit warping and/or bending in an electrical contacts region.

As described herein, in some embodiments, a packaging substrate can exhibit deformation in an electrical contacts region due to pressure applied upon the packaging substrate during manufacturing. Referring to FIG. 6, a plan view is shown of a packaging substrate 600 which can exhibit warping and/or bending in an electrical contacts region. The packaging substrate 600 can comprise an electronic module region 602. An electronic module boundary 612 can define a periphery of the electronic module region 602. The surface of the packaging substrate 600 shown in FIG. 6 can have an electrical contacts region 604 comprising electrical contacts formed thereon for the electronic module region 602. The packaging substrate 600 can exhibit bulging (e.g., outward from the page) in the electrical contacts region 602 due to pressure applied during a high-pressure manufacturing process upon an opposing surface opposite the surface shown in FIG. 6, such as an overmolding process.

The electrical contacts region can include a ground pad 606 and signal pins 608 formed thereon. The opposing surface (not shown) of the packaging substrate 600 can include a mounting region can be configured to receive a plurality of electronic components for the electronic module region 602. A saw street region 614 can extend around the electronic module region boundary 612. The saw street region 614 does not comprise any saw street feature formed thereon. A signal pin solder mask layer 610 can be formed over the signal pins 608. The ground pad 606 does not comprise any solder mask layer formed thereon. The packaging substrate 600 can become deformed in the region within the ground pad 606 during a high-pressure manufacturing process, such as during overmolding. In some embodiments, the packaging substrate 600 can also become deformed in the saw street region 614 during a high-pressure manufacturing process, such as an overmolding process.

During an overmolding process, pressure can be applied upon the opposing surface of the packaging substrate 600. The applied pressure can result in bulging of the packaging substrate 600 in the region within the ground pad 606. The region within the ground pad 606 may bend, for example outwardly from the page. The difference in height of the ground pad 604 and some other features formed on the surface of the packaging substrate 600 shown in FIG. 6 can contribute to the bending of the packaging substrate 600. For example, the ground pad 606 can have a height shorter than a height of some other features formed on the surface, such as a height of the signal pins 608 and the signal pins solder mask layer 610. The non-uniformity in height may facilitate bending of the packaging substrate 600 within the ground pad 606 due to pressure applied upon the opposing surface of the packaging substrate 600 during overmolding.

Figure 7:
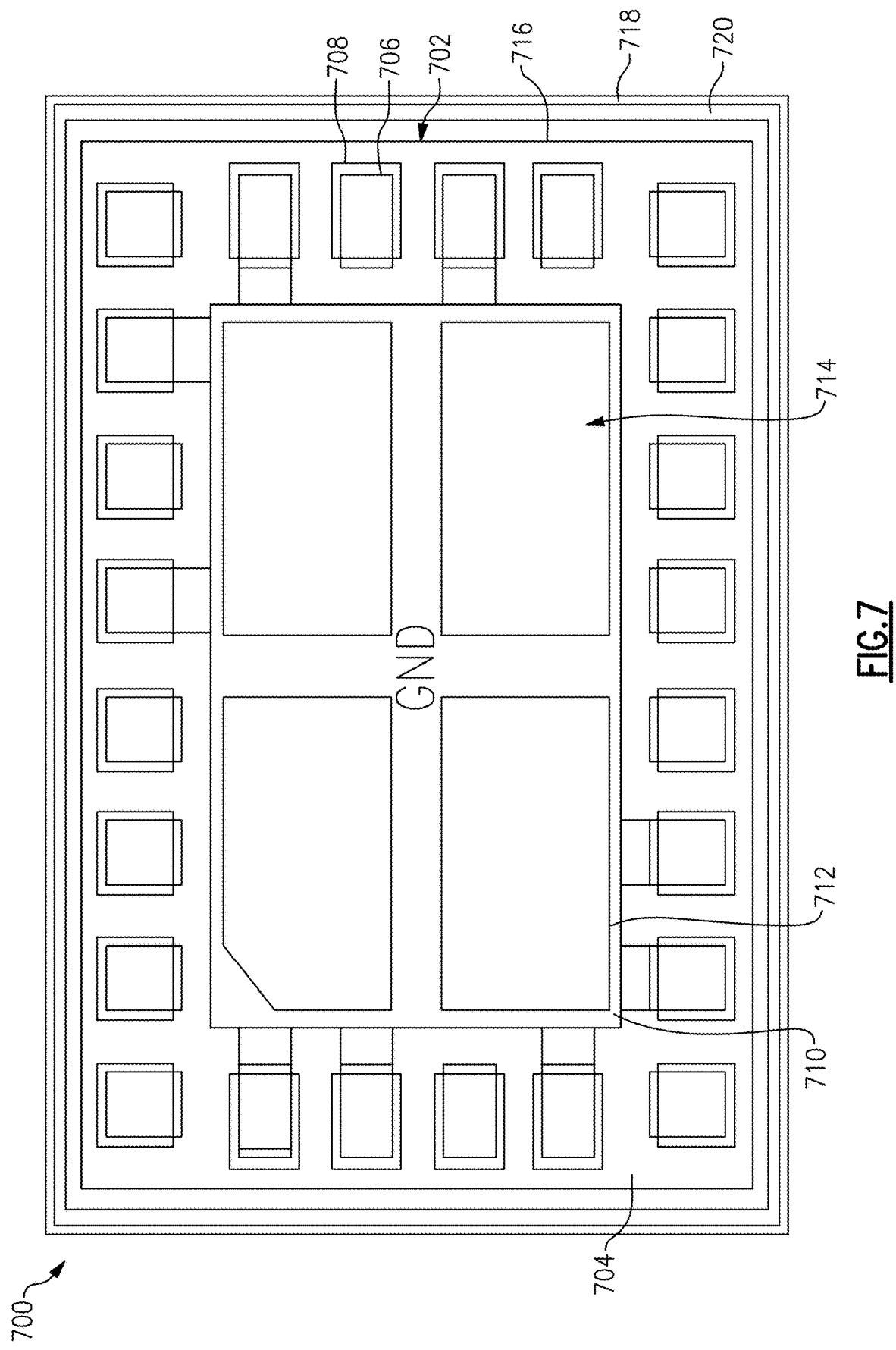
FIG. 7 shows a plan view of an example of a packaging substrate which comprises a ground pad solder mask layer formed thereon.
Figure 8:
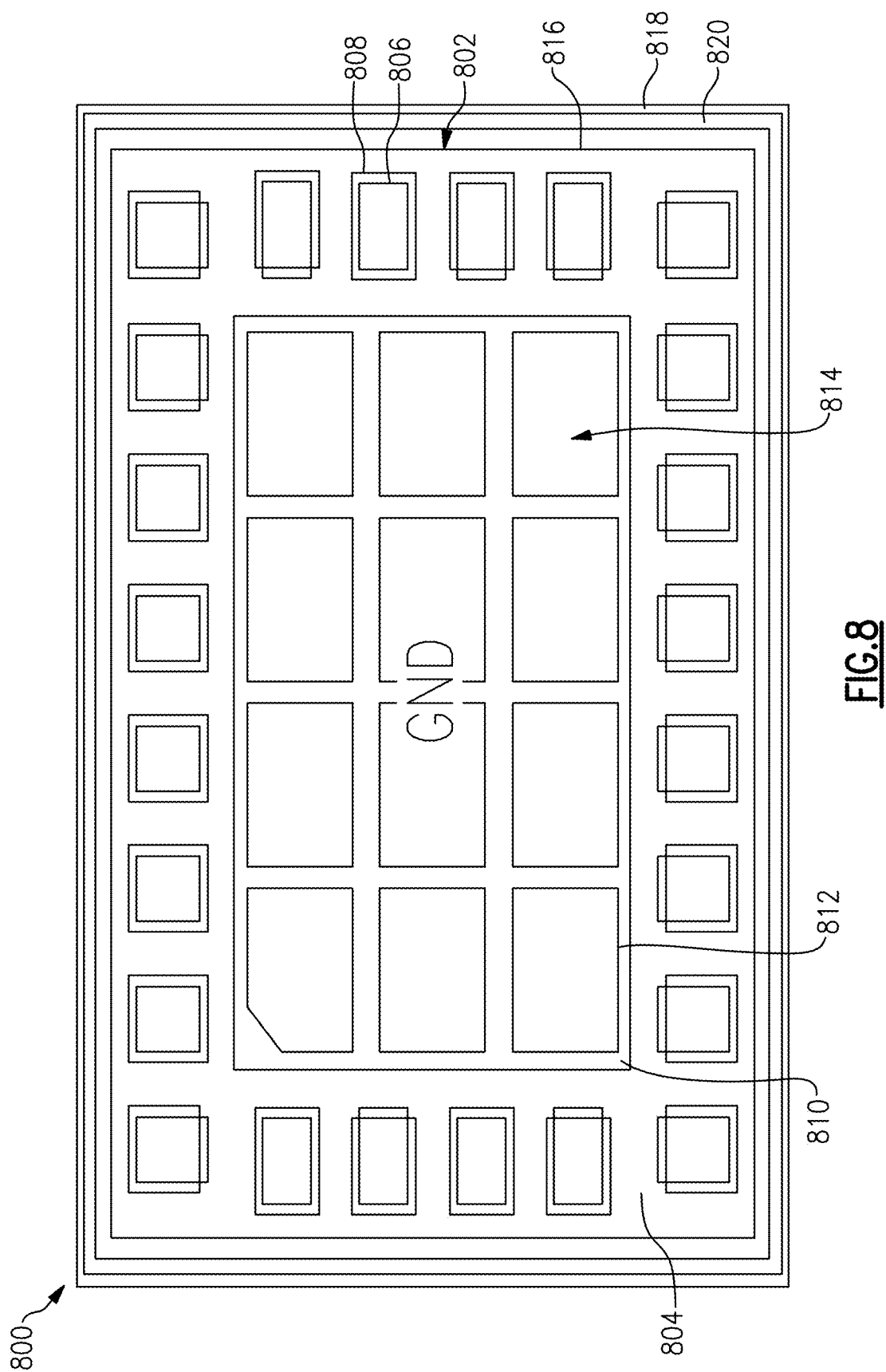
FIG. 8 shows a plan view of another example of a packaging substrate which comprises a ground pad solder mask layer formed thereon.
Figure 9:
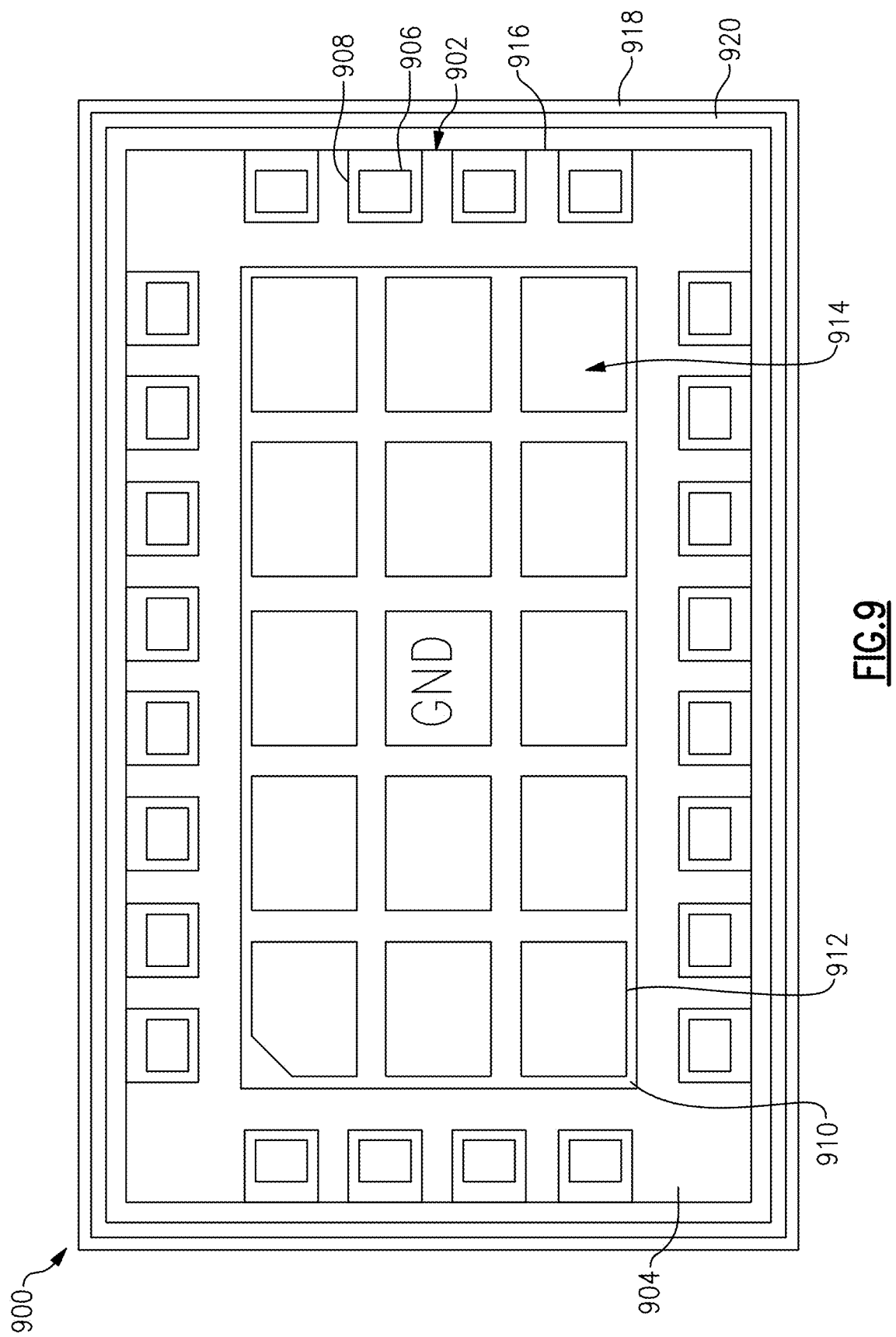
FIG. 9 shows a plan view of one more example of a packaging substrate which comprises a ground pad solder mask layer formed thereon.

FIGS. 7 through 9 are plan views of various packaging substrates which can exhibit no or reduced deformation in electrical contacts regions after being subjected to pressure applied during a high-pressure manufacturing process, such as during an overmolding process. As described in further detail herein, these packaging substrates can comprise respective ground pad features to facilitate the reduced or eliminated deformation in the electrical contacts regions. In FIG. 7, the packaging substrate 700 can comprise an electronic module region 702. An electronic module region boundary 716 can define a periphery of the electronic module region 702. The surface of the packaging substrate 700 shown in FIG. 7 can include an electrical contacts region 704 for the electronic module region 702. The electrical contacts region 704 can comprise a plurality of electrical contacts, such as signal pins 706 and a ground pad 710. Respective signal pin solder mask layers 708 can be formed over the signal pins 706.

The packaging substrate 700 can comprise a ground pad feature formed thereon. In some embodiments, the ground pad feature can comprise a ground pad solder mask layer 712. For example, the ground pad feature can be the ground pad solder mask layer 712. The ground pad solder mask layer 712 can be formed over portions of the ground pad 710 to provide desired reduction in height non-uniformity of features formed in the electrical contacts region 704. In some embodiments, a height of the ground pad solder mask layer 712 can be selected so as to reduce or eliminate a difference in total height of the ground pad 710 and the solder mask layer 712, and one or more other features formed on the surface of the packaging substrate 700 shown in FIG. 7. For example, the height of the ground pad solder mask layer 712 can be selected such that the total height of the ground pad 710 and the ground pad solder mask layer 712, is the same as or substantially the same as the total height of one or more of the signal pins 706 and the corresponding signal pin solder mask layer 708. In some embodiments, the height of the ground pad solder mask layer 712 can be the same or substantially the same as a height of one or more signal pin solder mask layers 708.

The ground pad solder mask layer 712 can have a plurality of openings 714. For example, the ground pad solder mask layer 712 can have a grid pattern. In some embodiments, the plurality of openings 714 can have the same or substantially the same size. In the example shown in FIG. 7, the ground pad solder mask layer 712 can have four openings 714. In some embodiments, the four openings 714 can have the same or similar size as one another. In some embodiments, the four openings 714 can have the same or similar shape as one another. An opening 714 can be rectangular or substantially rectangular.

In some embodiments, an opening can have a shape and/or size different from the remaining openings to provide a desired electrical performance for the resulting electronic module. A size of one or more of the plurality of openings of a ground pad solder mask layer can be selected to prevent or reduce bending of the area within the ground pad during an overmolding process, while allowing desired subsequent ground pad contact formation. In some embodiments, the plurality of openings can have the same or substantially the same size. In some embodiments, at least one of the plurality of openings has a size different from at least one other opening of the plurality of openings. In some embodiments, each of the plurality of openings can have a dimension no shorter than about 0.4 millimeters (mm). For example, a shortest dimension, such as a shortest length or shortest width, can be no less than about 0.4 mm. As an example, for illustrative purposes, an opening 714 of the ground pad solder mask layer 712 can have a length of about 1.5 mm and a width of about 1 mm.

The ground pad solder mask layer 712 can provide reduced height non-uniformity on the packaging substrate surface shown in FIG. 7, thereby providing improved resistance to bulging outwardly from the page of the packaging substrate 700 in the area within the ground pad 710. For example, pressure applied upon a surface of the packaging substrate 700 opposite that shown in FIG. 7, such as during an overmolding process, can tend to cause bowing outwardly from the page of one or more portions of the surface shown in FIG. 7. The ground pad solder mask layer 712 can provide improved resistance to the bowing of the packaging substrate 700 in the ground pad 710. For example, during a high-pressure process, the packaging substrate 700 can be rested upon a work surface, the surface shown in FIG. 7 facing and/or resting upon the work surface and the pressure being applied to the surface opposite that shown in FIG. 7. The improved height non-uniformity provided by the ground pad solder mask layer 712 can provide desired resistance to warping and/or bowing within the ground pad 710 as elevated pressure is exerted upon the surface of the packaging substrate 700 opposite that shown in FIG. 7.

As shown, the packaging substrate 700 can have a saw street feature 720 formed within the saw street region 718 surrounding the electronic module boundary 716. In some embodiments, the saw street feature 720 can comprise a saw street solder layer formed over a metal layer. The saw street feature 720 can comprise one or more features of the saw street feature 428 described with reference to FIG. 4. The saw street feature 720 can comprise a saw street solder mask layer over a metal layer. For example, the saw street feature 720 can be a saw street solder mask layer formed directly on a metal layer. The saw street feature 720 can completely surround the electronic module region 702. The saw street feature 720 can prevent or reduce bending of the saw street region 718 during a high-pressure process, such as an overmolding process.

FIGS. 8 and 9 show packaging substrates having features similar to the packaging substrate 700 described with reference to FIG. 7, but comprising ground pad solder mask layers having configurations different from that of the ground pad solder mask layer 712 formed on the ground pad 710 of FIG. 7. For example, the packaging substrates 800, 900 of FIGS. 8 and 9 can comprise respective electronic module regions 802, 902, each having an electronic module region boundary 816, 916. The surface of the packaging substrates 800, 900 shown can include an electrical contacts regions 804, 904 for the corresponding electronic module regions 802, 902. Each of electrical contacts region 804, 904 can comprise a plurality of electrical contacts, such as signal pins 806, 906 and a ground pads 810, 910. Respective signal pin solder mask layers 808, 908 can be formed over the signal pins 806, 906.

The packaging substrates 800, 900 can comprise a respective ground pad feature formed thereon. In some embodiments, the ground pad feature can comprise a ground pad solder mask layer 812 or a ground pad solder mask layer 912. For example, the respective ground pad feature can be the ground pad solder mask layer 812 or the ground pad solder mask layer 912. Ground pad solder mask layers 812, 912 can be formed over portions of the ground pads 810, 910. The ground pad solder mask layer 812 shown in FIG. 8 can have twelve openings 814. In some embodiments, the twelve openings 814 can have the same or similar size as one another. In some embodiments, the twelve openings 814 can have the same or similar shape as one another. For example, an opening 814 can have a rectangular or substantially rectangular shape. The ground pad solder mask layer 912 shown in FIG. 9 can have fifteen openings 914. In some embodiments, the fifteen openings 914 can have the same or similar size as one another. In some embodiments, the fifteen openings 914 can have the same or similar shape as one another. For example, an opening 914 can have a rectangular or substantially rectangular shape. In some embodiments, an opening can have a shape and/or size different from the remaining openings to provide a desired electrical performance for the resulting electronic module. In some embodiments, each of the plurality of openings can have a dimension no shorter than about 0.4 millimeters (mm). For example, a shortest dimension, such as a shortest width or shortest length, can be no less than about 0.4 mm. As an example, for illustrative purposes, an opening 814 of the ground pad solder mask layer 812 can have a length of about 0.75 mm and a width of about 0.66 mm. As another example, an opening 914 of the ground pad solder mask layer 912 can have a length of about 0.64 mm and a width of about 0.5 mm.

As shown, the packaging substrates 800, 900 can have respective saw street features 820, 920 formed within the saw street regions 818, 918. The saw street regions 818, 918 can surround the respective electronic module boundary 816, 916. The saw street features 820, 920 can completely surround the respective electronic module region 802, 902. The saw street features 820, 920 can have one or more features of the saw street feature 428 described with reference to FIG. 4.

It will be understood that a ground pad solder mask layer can have more or fewer openings as those shown in FIGS. 7 through 9. The shape, size and/or arrangement of openings in the ground pad solder mask layer can be selected to provide desired height uniformity while maintaining desired performance for the resulting electronic module. In some embodiments, a number of openings in a ground pad solder mask layer can be selected to provide desired reduction in bending of the substrate while allowing for openings having a size such that subsequent desired formation of ground pad contacts can be performed. In some embodiments, an opening of a plurality of openings of a ground pad solder mask layer can have a dimension, such as a length and/or a width, of about 0.4 mm to about 1.5 mm, including about 0.4 mm to about 1.2 mm, about 0.4 mm to about 1.0 mm, about 0.4 mm to about 0.8 mm, about 0.4 mm to about 0.7 mm, about 0.4 mm to about 0.6 mm, or about 0.4 mm to about 0.5 mm. In some embodiments, the plurality of openings can be the same or substantially the same size and shape.

Packaging substrates comprising one or more features as described herein can be used in the fabrication of various electronic modules. For example, packaging substrates comprising saw street features and/or ground pad features can be used in the fabrication of electronic modules of any number of electronic devices, including mobile electronic devices. The electronic modules can be used in various applications, including in radio-frequency (RF) and related applications. For example, the electronic modules can be incorporated into RF devices. In some embodiments, the electronic modules can be used in wireless communication applications. In some embodiments, the electronic devices can include single-band and/or multi-band wireless devices. In another example, the wireless device can be a device which has multiple antennas such as diversity antenna, and additional connectivity features such as Wi-Fi, Bluetooth, and GPS.

FIG. 10 is a schematic diagram of a wireless device 1000 which can include an electronic module 1010. The electronic module 1010 can comprise one or more features of one or more electronic modules described herein. For example, the electronic module 1010 can comprise a packaging substrate including one or more ground pad features as described herein. For example, the packaging substrate can have a ground pad and a ground pad solder mask layer formed thereon, where the ground pad solder mask layer has a plurality of openings. The ground pad solder mask layer may have a grid pattern. In some embodiments, the plurality of openings can have a uniform or substantially uniform size and/or shape. The electronic module 1010 can be free or substantially free from any bending and/or warping in the ground pad area. In some embodiments, the packaging substrate of the electronic module 1010 could have been fabricated using one or more processes which included use of one or more saw street features as described herein. In some embodiments, the wireless device 1000 can include a plurality of electronic modules comprising one or more features described herein, and/or fabricated using processes which include one or more features as described herein.

FIG. 11 is an example of a packaging substrate fabrication process 1100. The packaging substrate fabrication process 1100 can be used to fabricate one or more packaging substrates which can demonstrate no or reduced deformation as a result of a high-pressure process, such as an overmolding process, such as one or more packaging substrates as described herein. In block 1102, a packaging substrate can be provided or formed, where the packaging substrate can comprise on a first surface a mounting region to allow mounting of electronic components thereon, and on a second opposing surface electrical contacts formed thereon, and a saw street region surrounding the mounting region. A plurality of electronic components can be mounted in the mounting region in a subsequent process, such as to provide an electronic module. A saw street feature can be formed in the saw street region. As described herein, a saw street feature can comprise a solder mask layer over a metal layer. For example, in block 1104, a metal layer and a solder mask layer can be formed within the saw street region on the second opposing surface, the solder mask layer being formed over the metal layer.

In some embodiments, the metal layer can be formed directly on the second opposing surface. In some embodiments, the solder mask layer can be formed directly on the metal layer. For example, the solder mask layer can be formed directly on the metal layer and encapsulate the metal layer. Forming the solder mask layer and the metal layer within the saw street region can comprise forming the solder mask layer and the metal layer in the saw street region to surround or substantially surround the electrical contacts.

In some embodiments, an electrical contact solder mask layer can be formed over at least a portion of an electrical contact on the second opposing surface, a total height of the solder mask layer and the metal layer formed within the saw street region being the same or substantially the same as a total height of the electrical contact and the electrical contact solder mask layer.

In some embodiments, in subsequent processing, a plurality of electronic components can be mounted in the mounting region so as to provide an electronic module comprising the electronic components mounted on the first surface and the electrical contacts on the second opposing surface. An overmolding process can be performed to encapsulate the packaging substrate and the electronic components mounted thereon. As described herein, a packaging substrate can comprise one or more electronic modules. In some embodiments, the encapsulated packaging substrate can be cut to separate one or more electronic modules from the packaging substrate, where the metal layer and the solder mask layer formed in the saw street region are excluded from the individual electronic modules.

In some embodiments, the packaging substrate can comprise more than one mounting region on the first surface and more than one corresponding regions comprising electrical contacts on the second opposing surface. The saw street region can extend between the plurality of mounting regions and regions comprising electrical contacts so as to separate each of the mounting regions and corresponding regions comprising electrical contacts from adjacent and/or neighboring mounting regions and corresponding regions comprising electrical contacts. The metal layer and the solder mask layer can be formed in the saw street region to surround each of the plurality of mounting regions and regions comprising electrical contacts.

In some embodiments, the metal layer and the solder mask layer can have a width to enable cutting of the packaging substrate to allow separation of the plurality of mounting regions and corresponding regions comprising electrical contacts from one another without damaging any of the mounting regions and corresponding regions comprising electrical contacts. In some embodiments, the metal layer and the solder mask layer can have a width to allow separation of the plurality of mounting regions and corresponding regions comprising electrical contacts from one another without having to cut through any portion of the metal layer and the solder mask layer. In subsequent processing, electronic components can be mounted in the respective mounting regions so as to provide a plurality of electronic modules. An overmolding process can be performed to encapsulate the packaging substrate and the electronic modules. The packaging substrate can be cut to separate the individual electronic modules from one another, where the metal layer and the solder mask layer formed in the saw street region are excluded from the individual electronic modules.

FIG. 12 is an example of an electronic module fabrication process 1200. The electronic module fabrication process 1200 can be used to fabricate one or more electronic modules described herein. In block 1202, a mounting region can be provided or formed on a first surface of a packaging substrate to allow mounting of electronic components thereon, and a ground pad can be provided or formed on a second opposing surface of the packaging substrate. In block 1204, a solder mask layer having a plurality of openings can be formed over the ground pad. For example, the solder mask layer can be formed directly on the ground pad.

The solder mask layer formed over the ground pad can have a grid pattern. In some embodiments, the plurality of openings of the solder mask layer can be formed so as to have the same or substantially the same size. A size of one or more of the plurality of openings can be selected to prevent or reduce bending of the ground pad area during an overmolding process, while allowing desired subsequent ground pad contact formation. In some embodiments, each of the plurality of openings can have a shortest dimension of no less than about 0.4 millimeters (mm).

A plurality of electronic components can be mounted in the mounting region. For example, an electronic module comprising a plurality of electronic components mounted on the first surface and a ground pad having a solder mask layer formed thereon on the second opposing surface can be provided. The second opposing surface may comprise other electrical contacts and electrical contact solder mask layers formed thereon. In some embodiments, an overmolding process can be performed to encapsulate the electronic module and the packaging substrate, the encapsulated packaging substrate and electronic module comprising the ground pad having the solder mask layer formed thereon on the second surface.

In some embodiments, the packaging substrate can comprise more than one mounting region on the first surface and more than one corresponding ground pad formed on the second opposing surface. The packaging substrate can comprise a saw street region which surrounds and separates each of the mounting regions and corresponding ground pads. In some embodiments, the saw street region can comprise formed therein a solder mask layer over a metal layer, the solder mask layer and the metal layer separating and surrounding each of the mounting regions and corresponding ground pads. Electronic components can be mounted in the respective mounting regions to provide a plurality of electronic modules. In some embodiments, an overmolding process can be performed to encapsulate the packaging substrate and electronic modules. The encapsulated packaging substrate and electronic modules can be cut to separate the individual electronic modules from one another, the individual electronic modules comprising the ground pad having the ground pad solder mask layer formed thereon. The solder mask layer and metal layer formed in the saw street region can be excluded from the individual electronic modules.

In some embodiments, the solder mask layer formed in the saw street region can be formed using a dry film method. In some embodiments, the solder mask layer formed over the ground pad can be formed using a dry film method. The dry film method may demonstrate improved uniformity in height, for example as compared to a liquid film method. Improved uniformity in height of the solder mask layer in the saw street region and/or the solder mask layer on the ground pad can facilitate prevention or reduction of bending of the packaging substrate in those regions.

Formation of the metal film layer and the solder mask layer can be incorporated into a process for forming the electrical contacts and electrical contact solder mask layers on the second opposing surface. For example, a design for the features on the second opposing surface can include a metal film and a solder mask layer in the saw street region and/or on a ground pad. The metal film and the solder mask layer in the saw street region and/or on the ground pad may be formed in a process for forming the metal contacts and metal contact solder mask layers without using a separate and distinct process. Including formation of the metal film and the solder mask layer in the same process used for forming electrical contacts and electrical contact solder mask layer can facilitate reduced fabrication costs in incorporating the metal film and solder mask layer. Accordingly, an efficient and cost effective process for manufacturing packaging substrates which does not or substantially does not bend during an overmolding process can be provided.

Figure 13A:
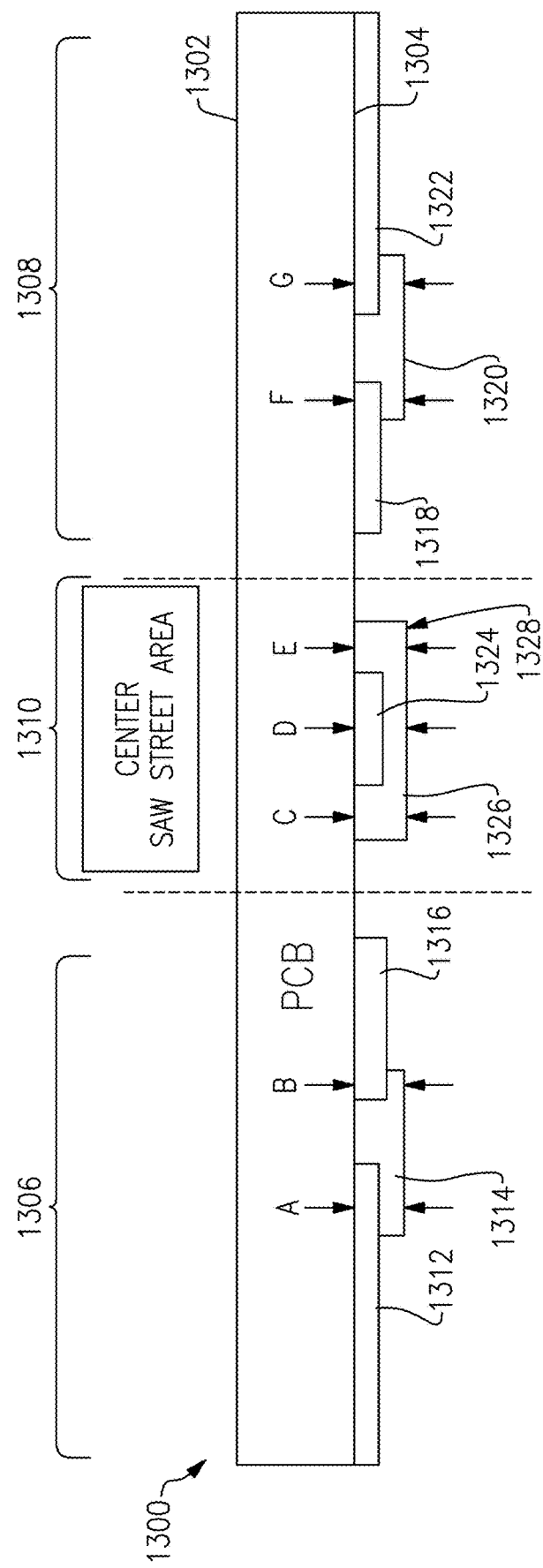
FIG. 13A is a cross-sectional view of an example of a packaging substrate comprising a saw street feature.
Figure 13B:
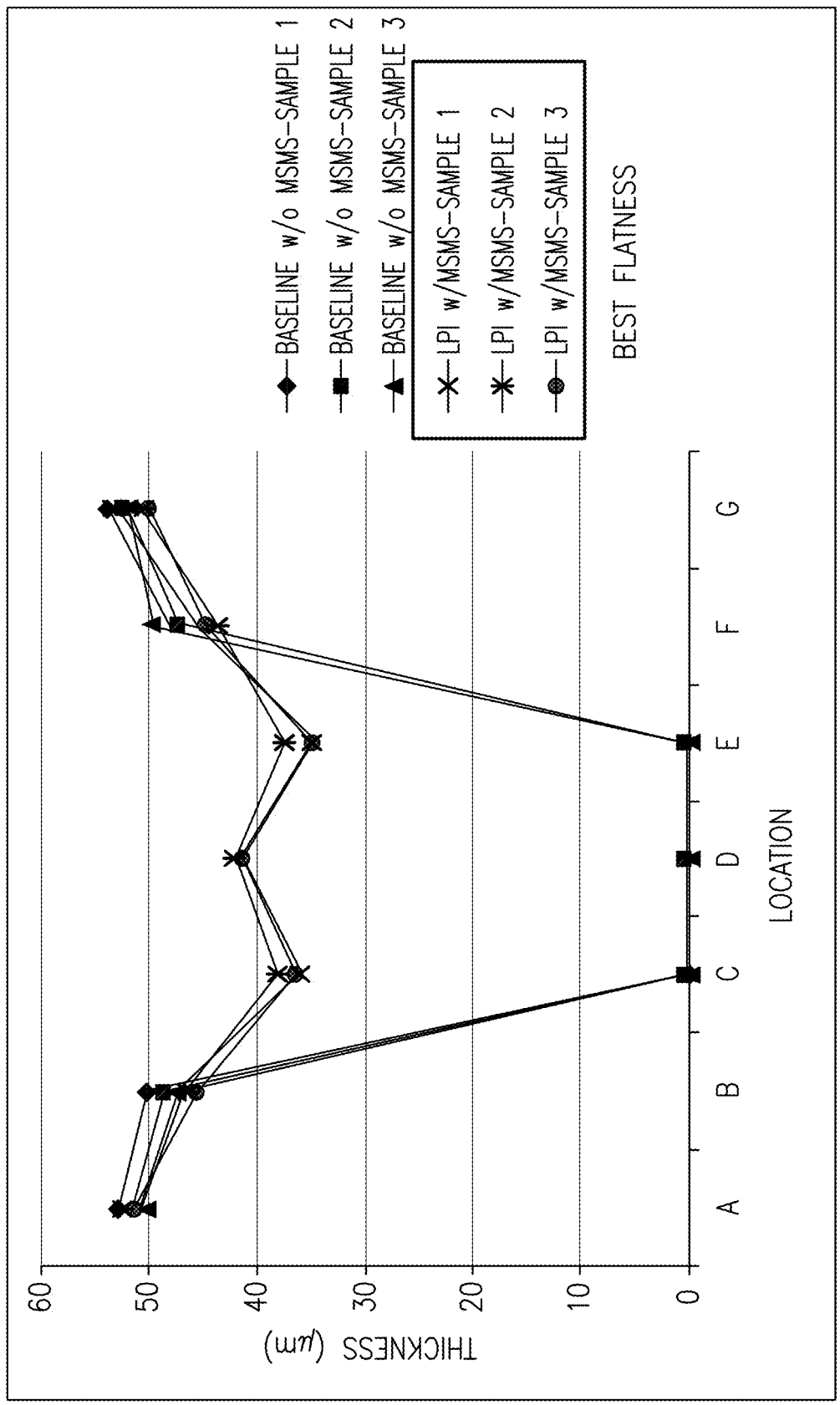
FIGS. 13B, 13C and 13D are graphs showing heights at various predetermined locations across packaging substrates which have the features of the packaging substrate of FIG. 13A, and heights at the same predetermined locations across packaging substrates which have features of the packaging substrate of FIG. 13A but no saw street feature.
Figure 13C:
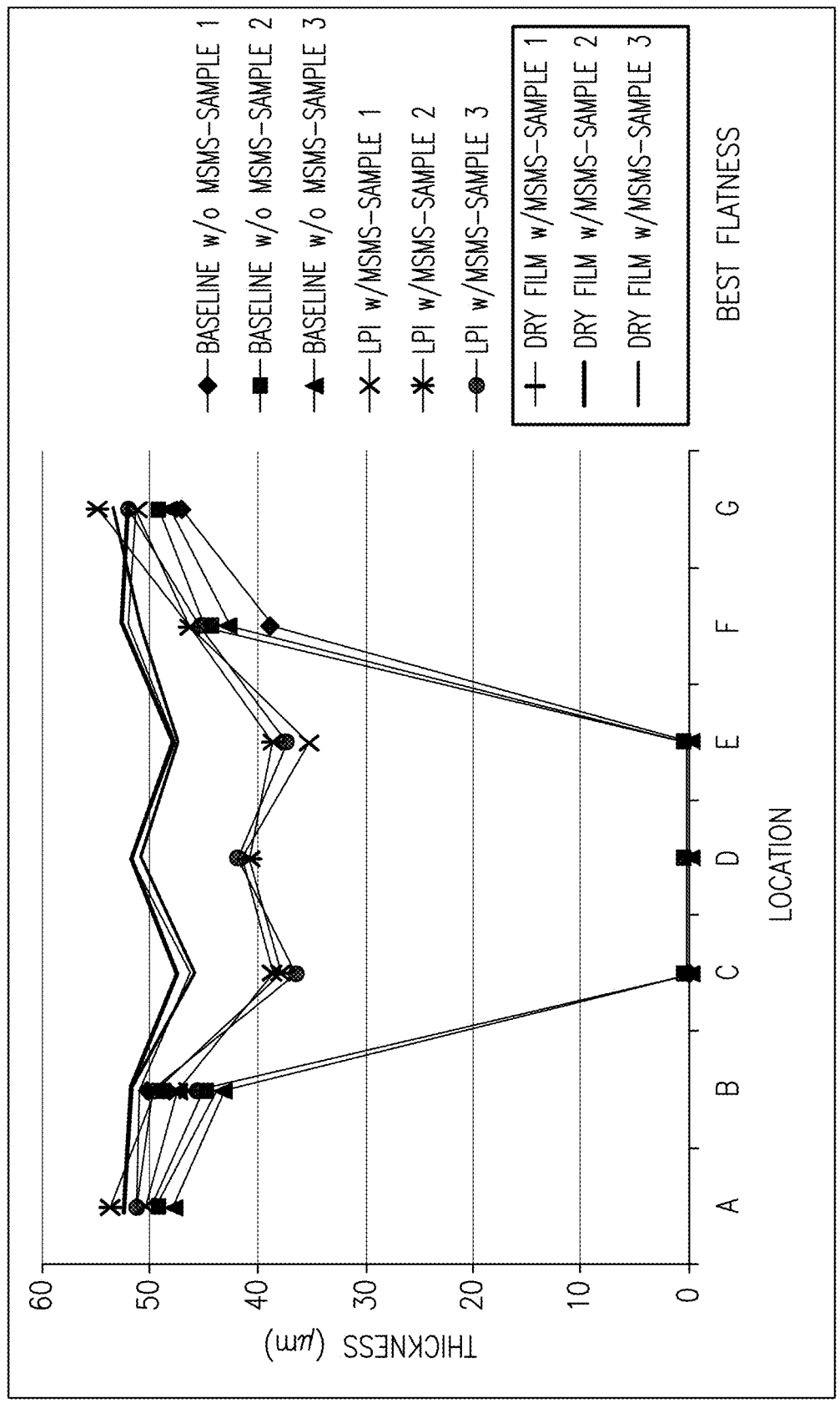
Figure 13D:
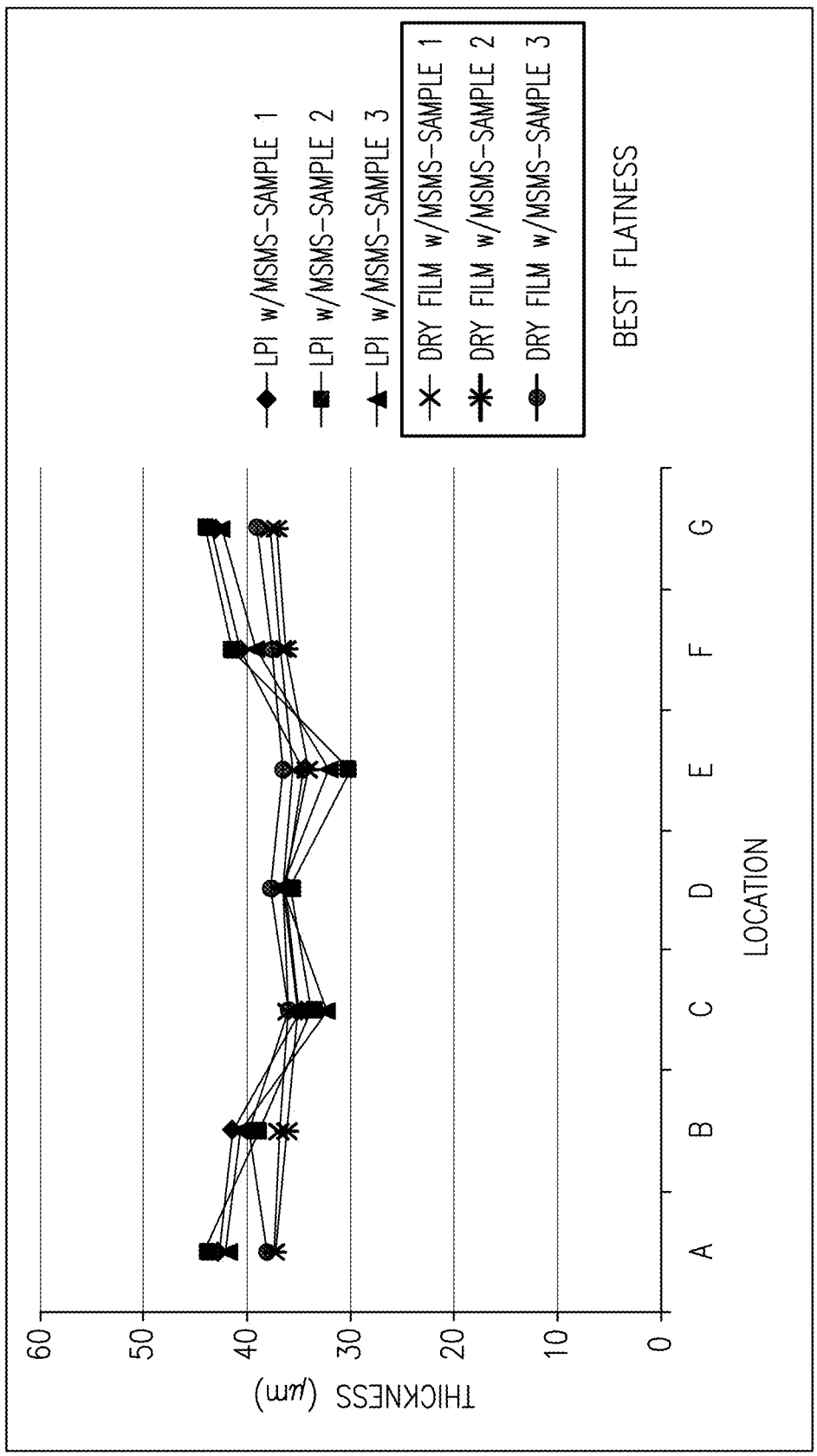

FIG. 13A is a cross-sectional view of an example of a packaging substrate 1300 comprising a saw street feature 1328. FIGS. 13B, 13C and 13D are graphs showing heights at various predetermined locations across packaging substrates which have the features of packaging substrate 1300, and of heights at the same predetermined locations across packaging substrates which have features of the packaging substrate 1300 but no saw street feature 1328. Referring to FIG. 13A, the packaging substrate 1300 can have a first surface 1302 and a second opposing surface 1304. The packaging substrate 1300 can have a first mounting region 1306 and a second mounting region 1308 on the first surface 1302. The second opposing surface 1304 can have corresponding regions comprising electrical contacts for each of the first mounting region 1306 and the second mounting region 1308. The first mounting region 1306 and corresponding region for electrical contacts, and the second mounting region 1308 and corresponding region for electrical contacts are separated by a saw street region 1310. The second opposing surface 1304 can have a first ground pad 1312 and a first signal pin 1316 for the first mounting region 1306 and a second ground pad 1322 and a second signal pin 1318 for the second mounting region 1308. A first solder mask layer 1314 can be formed between and partially over each of the first ground pad 1312 and first signal pin 1316. A second solder mask layer 1320 can be formed between and partially over each of the second ground pad 1322 and second signal pin 1318. Electronic components, such as electronic dies (not shown), can be mounted on the first surface 1302 in the first mounting region 1306 and second mounting region 1308, such as to provide a first electronic module and a second electronic module, respectively. A saw street feature 1328 can be formed on the second opposing surface 1304 in the saw street region 1310. For example, the saw street feature 1328 can comprise a saw street solder mask layer 1326 formed over a metal layer 1324. The saw street feature 1328 can be the metal layer 1324 formed directly on the second opposing surface 1304, and the saw street solder mask layer 1326 formed directly on the metal layer 1324.

FIGS. 13B, 13C and 13D are graphs which show the height of features on packaging substrates which correspond to the features on the second opposing surface 1304 at each of the locations labeled A, B, C, D, E, F and G in FIG. 13A. The heights graphed are the dimensions which correspond to dimensions between the pairs of arrows corresponding to each of the labels. The locations labeled in FIG. 13A are as follows: A (a height between the second opposing surface 1304 and the outward facing surface of a portion of the first solder mask layer 1314 that is formed over the first ground pad 1312), B (a height between the second opposing surface 1304 and the outward facing surface of the first solder mask layer 1314 that is formed over the first signal pin 1316), C (a height between the second opposing surface 1304 and a first portion the outward facing surface of the saw street solder mask layer 1326, if present, such as a portion which is not formed over the metal layer 1324), D (a height between the second opposing surface 1304 and the outward facing surface of the saw street solder mask layer 1326 that is formed over the metal layer 1324, if present), E (a height between the second opposing surface 1304 and the outward facing surface of a second portion of the saw street solder mask layer 1326, if present, such as a portion which is not formed over the metal layer 1324), F (a height between the second opposing surface 1304 and the outward facing surface of the second solder mask layer 1320 that is formed over the second signal pin 1318), and G (a height between the second opposing surface 1304 and the outward facing surface of the second solder mask layer 1320 that is formed over the second ground pad 1322).

Referring to FIG. 13B, height is shown in microns (μm) at locations A through G of packaging substrates comprising the features of the packaging substrate 1300 of FIG. 13A, except the saw street feature 1328. FIG. 13B also graphs height at locations A through G of packaging substrates comprising all of the features of the packaging substrate 1300 of FIG. 13A, including the saw street feature 1328 (e.g., including a saw street solder mask layer formed over a metal layer), and where the solder mask layers are formed using a liquid film method. As shown in FIG. 13B, the packaging substrates comprising a saw street solder mask layer over a metal layer on a second opposing surface exhibited less variation in height, or better flatness, across the second opposing surface. In FIG. 13C, height is shown in microns (μm) at locations A through G of: packaging substrates comprising features of the packaging substrate 1300 of FIG. 13A, except the saw street feature (e.g., no saw street solder mask layer and no metal layer); packaging substrates comprising all of the features of the packaging substrate 1300 of FIG. 13A, where the saw street solder mask layer is formed using a liquid film method; and packaging substrates comprising all of the features of the packaging substrate 1300 of FIG. 13A, where the saw street solder mask layer is formed using a dry film method. As shown in FIG. 13C, the least variation in height, or best flatness, across the packaging substrate on the second opposing surface can be seen in packaging substrates comprising the saw street solder mask layer formed over the metal layer, where the solder mask layers are formed using the dry film method. Referring to FIG. 13D, height is shown in microns (μm) at locations A through G of packaging substrates comprising the features of the packaging substrate 1300 of FIG. 13A (e.g., comprising a saw street solder mask layer formed over a metal layer), and where the solder mask layers are formed using either a liquid film method or a dry film method. As shown in FIG. 13D, the least variation in height, or best flatness, across the packaging substrate on the second opposing surface, can be seen in packaging substrates comprising the solder mask layers formed using the dry film method.

FIGS. 14A, 14B and 14C show simulations of the degree of bending of various packaging substrates which have been subjected to a molding pressure of about 1,000 pounds per square inch (psi), and FIGS. 14D, 14E and 14F show simulations of the epoxy peel stress corresponding to each of the substrates of FIGS. 14A, 14B and 14C, respectively. The packaging substrate of FIGS. 14A and 14D does not comprise any saw street feature formed in the saw street region. FIG. 14A shows that the bending of the packaging substrate which, for example, comprises no saw street solder mask layer formed over a metal layer is about 8 microns (μm). FIG. 14D shows that the epoxy peel stress of this substrate is about 15 megapascals (MPa). The packaging substrate of FIGS. 14B and 14E comprises a saw street feature which includes a saw street solder mask layer formed using a liquid film method. FIG. 14B shows that the bending of the packaging substrate which comprises the saw street solder mask layer formed using a liquid film method is at about 8 microns (μm). FIG. 14E shows the epoxy peel stress of this substrate is about 15 megapascals (MPa). The packaging substrate of FIGS. 14C and 14F comprises a saw street feature which has a saw street solder mask layer formed using a dry film method. FIG. 14C shows that the bending of the packaging substrate which comprises the saw street solder mask layer formed using a dry film method is at about 1.2 microns (μm). FIG. 14F shows the epoxy peel stress of this substrate is about 0.3 megapascals (MPa). Of the examples shown in FIGS. 14A through 14F, the packaging substrate which comprises the saw street solder mask layer formed using the dry film method demonstrated the least amount of bending and epoxy peel stress amongst the three tested packaging substrates. Reducing bending and epoxy peel stress of packaging substrates can prevent or reduce deformation and warping of the packaging substrate.

Figure 15A:
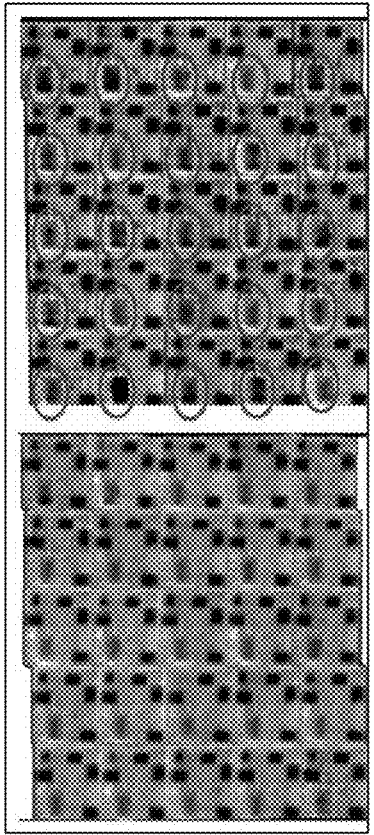
FIGS. 15A and 15B show through scanning acoustic microscopy (TSCAN) images of the moisture sensitivity level analyses of a packaging substrate comprising no saw street features formed thereon and a packaging substrate comprising saw street features formed thereon, respectively.
Figure 15B:
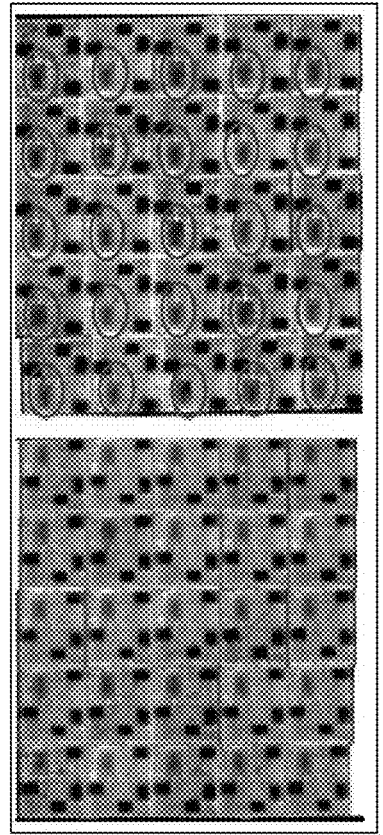

FIGS. 15A and 15B show through scanning acoustic microscopy (TSCAN) images of the moisture sensitivity level analyses of a packaging substrate comprising no saw street features formed thereon and a packaging substrate comprising saw street features formed thereon, respectively. FIG. 15A shows through scanning acoustic microscopy (TSCAN) images of before and after moisture sensitivity level analysis of a packaging substrate which, for example, comprises no saw street solder mask layer formed over a metal layer in the saw street regions. Dark features circled in the post moisture sensitivity level analysis indicate delamination. For example, the power amplifier die is shown as having delaminated in the post moisture sensitivity level analysis image of FIG. 15A. FIG. 15B shows through scanning acoustic microscopy (TSCAN) images, before and after moisture sensitivity level analysis, of a packaging substrate which does comprise, for example, a saw street solder mask layer formed over a metal layer in the saw street regions. No power amplifier die delamination is observed in the post moisture sensitivity level analysis image. The circled features in the post moisture sensitivity level analysis image of FIG. 15B are of a lighter color than circled features in the post moisture sensitivity level analysis image of FIG. 15A, for example demonstrating that sound waves are bounced back to a lesser degree, thereby indicating that no delamination has occurred.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaging substrate comprising:
   a first surface and a second opposing surface, the first surface including a first mounting region of a first electronic module region and the second opposing surface including a first electrical contacts region of the first electronic module region;
   a saw street region including at least a portion that surrounds the first electronic module region; and
   a saw street feature formed on the second opposing surface within at least a portion of the saw street region, the saw street feature being a solder mask layer over a metal layer and centered along the saw street region.

2. The packaging substrate of claim 1 wherein the saw street feature on the second opposing surface extends continuously around the first electronic module region.

3. The packaging substrate of claim 1 further comprising a second electronic module region adjacent to the first electronic module region, wherein a portion of the saw street region is between the first and second electronic module regions, and the saw street feature on the second opposing surface includes a portion within the portion of the saw street region between the first and second electronic module regions.

4. The packaging substrate of claim 1 wherein the saw street region includes portions extending along edges of the packaging substrate, and the saw street feature on the second opposing surface includes portions within the portions of the saw street region extending along the edges of the packaging substrate.

5. The packaging substrate of claim 1 wherein the saw street feature has a width less than a width of the saw street region.

6. The packaging substrate of claim 1 wherein the metal layer of the saw street feature has a height the same as a height of an electrical contact formed in the first electrical contacts region.

7. The packaging substrate of claim 1 wherein an electrical contact solder mask layer formed on at least a portion of an electrical contact that is in the first electrical contacts region has a height the same as a height of the solder mask layer.

8. The packaging substrate of claim 1 wherein a total height of the solder mask layer and the metal layer formed within the saw street region is the same as a total height of an electrical contact formed on the second opposing surface in the first electrical contacts region and an electrical contact solder mask layer formed over at least a portion of the electrical contact.

9. The packaging substrate of claim 1 wherein the first electrical contacts region includes a ground pad having a ground pad solder mask layer formed thereon, the ground pad solder mask layer having a plurality of openings.

10. The packaging substrate of claim 9 wherein an electrical contact formed on the second opposing surface in the first electrical contacts region includes an electrical contact solder mask layer formed on at least a portion thereof, the electrical contact and the electrical contact solder mask layer having a total height the same as a total height of the ground pad solder mask layer and the ground pad.

11. The packaging substrate of claim 1 wherein the first mounting region is configured to receive a power amplifier.

12. A method of fabricating a packaging substrate, the method comprising:
providing or forming a first electronic module region on the packaging substrate, and a saw street region including at least a portion that surrounds the first electronic module region;
providing or forming a first mounting region on a first surface of the packaging substrate for the first electronic module region, a first electrical contacts region on a second opposing surface of the packaging substrate for the first electronic module region; and
forming a saw street feature on the second opposing surface within the saw street region and centered along the saw street region, the saw street feature being a solder mask layer over a metal layer.

13. The method of claim 12 wherein forming the saw street feature includes forming the saw street feature to continuously extend around the first electrical contacts region.

14. The method of claim 12 further comprising providing or forming a second electronic module region on the packaging substrate adjacent to the first electronic module region, wherein the saw street region includes a portion between the first and second electronic module regions, and the saw street feature includes a portion within the portion of the saw street region between the first and second electronic module regions.

15. The method of claim 12 wherein providing or forming the saw street region includes providing or forming portions of the saw street region along edges of the packaging substrate, and forming the saw street feature on the second opposing surface includes forming portions of the saw street feature within the portions of the saw street region along the edges of the packaging substrate.

16. The method of claim 12 wherein forming the saw street feature includes forming a metal layer having a height the same as a height of an electrical contact on the second opposing surface within the first electrical contacts region.

17. The method of claim 12 further comprising forming an electrical contact solder mask layer over at least a portion of an electrical contact on the second opposing surface in the first electrical contacts region, a total height of the solder mask layer and the metal layer formed within the saw street region being the same as a total height of the electrical contact and the electrical contact solder mask layer.

18. The method of claim 12 further comprising forming or providing a ground pad on the second opposing surface within the first electrical contacts region and forming a ground pad solder mask layer including a plurality of openings having a grid pattern over the ground pad.

\* \* \* \* \*